United States Patent
Ilani et al.

(10) Patent No.: US 10,097,208 B2
(45) Date of Patent: Oct. 9, 2018

(54) ERROR LOCATOR POLYNOMIAL DECODER METHOD

(71) Applicant: WESTERN DIGITAL TECHNOLOGIES, INC., Irvine, CA (US)

(72) Inventors: Ishai Ilani, Dolev (IL); Idan Alrod, Herzliya (IL)

(73) Assignee: Western Digital Technologies, Inc., Irvine, CA (US)

(*) Notice: Subject to any disclaimer, the term of this patent is extended or adjusted under 35 U.S.C. 154(b) by 0 days.

(21) Appl. No.: 15/456,648

(22) Filed: Mar. 13, 2017

(65) Prior Publication Data

US 2017/0187391 A1 Jun. 29, 2017

Related U.S. Application Data

(63) Continuation-in-part of application No. 15/343,866, filed on Nov. 4, 2016, and a continuation-in-part of
(Continued)

(51) Int. Cl.
*H03M 13/15* (2006.01)
*G06F 11/10* (2006.01)
(Continued)

(52) U.S. Cl.
CPC ....... *H03M 13/153* (2013.01); *G06F 11/1068* (2013.01); *G11C 29/52* (2013.01); *H03M 13/1575* (2013.01); *H03M 13/617* (2013.01)

(58) Field of Classification Search
CPC ......... H02M 2003/075; H03M 13/151; H03M 13/153; H03M 13/1575; H03M 13/1545;
(Continued)

(56) References Cited

U.S. PATENT DOCUMENTS

| | | | | |
|---|---|---|---|---|
| 5,517,509 A | * | 5/1996 | Yoneda | H03M 13/132 341/94 |
| 5,742,620 A | * | 4/1998 | Iwamura | H03M 13/151 714/780 |

(Continued)

FOREIGN PATENT DOCUMENTS

CN 101951265 A 1/2011

OTHER PUBLICATIONS

Lin et al., "A 2.56 Gb/s Soft RS (255, 239) Decoder Chip for Optical Communication Systems," IEEE Transactions on Circuits and Systems—I: Regular Papers, vol. 61, No. 7, Jul. 2014, pp. 2110-2118.
(Continued)

*Primary Examiner* — Phung M Chung
(74) *Attorney, Agent, or Firm* — Michael Best & Friedrich LLP

(57) ABSTRACT

A decoder includes an error locator polynomial generator circuit configured to determine, during a first cycle of a clock signal, a first value of a parameter. The first value of the parameter is associated with a first iteration of a decode operation and is based on a value of an error locator polynomial associated with a prior iteration of the decode operation. The error locator polynomial generator circuit is further configured to determine, during a second cycle of the clock signal that sequentially follows the first cycle or during a third cycle of the clock signal that sequentially follows the second cycle, an adjusted value of the error locator polynomial. The adjusted value of the error locator polynomial is associated with a second iteration of the decode operation and is based on the first value of the parameter.

20 Claims, 19 Drawing Sheets

Related U.S. Application Data application No. 15/373,313, filed on Dec. 8, 2016, and a continuation-in-part of application No. 14/963,025, filed on Dec. 8, 2015.

(60) Provisional application No. 62/192,513, filed on Jul. 14, 2015.

(51) Int. Cl.
*G11C 29/52* (2006.01)
*H03M 13/00* (2006.01)

(58) Field of Classification Search
CPC .............. H03M 13/157; H03M 13/617; G06F 11/1068; G11C 29/52
See application file for complete search history.

(56) References Cited

U.S. PATENT DOCUMENTS

| | | | |
|---|---|---|---|
| 6,571,368 B1* | 5/2003 | Chen | H03M 13/1515 714/784 |
| 6,990,624 B2* | 1/2006 | Dohmen | H03M 13/1535 714/782 |
| 8,132,081 B1 | 3/2012 | Wu | |
| 8,301,987 B2 | 10/2012 | Dror et al. | |
| 8,949,697 B1 | 2/2015 | Chang | |
| 2011/0239094 A1 | 9/2011 | Kwok et al. | |
| 2014/0281839 A1 | 9/2014 | Kwok | |
| 2016/0103735 A1 | 4/2016 | Lee et al. | |

OTHER PUBLICATIONS

Liu et al., "Low-Power High-Throughput BCH Error Correction VLSI Design for Multi-Level Cell NAND Flash Memories," 2006 IEEE Workshops on Signal Processing Systems Design and Implementation, Banff, Canada, Oct. 2-4, 2006, pp. 303-308.

Massey, "Shift-Register Synthesis and BCH Decoding," IEEE Transactions on Information Theory, vol. IT-15, No. 1, Jan. 1969, pp. 122-127.

Yoon et al., "A Discrepancy-Computationless RiBM Algorithm and Its Architecture for BCH Decoders," 2008 IEEE International SOC Conference, Sep. 17-20, 2008, Newport Beach, CA, pp. 379-382.

* cited by examiner

ERROR LOCATOR POLYNOMIAL DECODER METHOD

CROSS-REFERENCE TO RELATED APPLICATIONS

This application is a continuation-in-part of U.S. Non-provisional application Ser. No. 15/343,866 filed Nov. 4, 2016 and entitled "METHOD AND DECODER TO ADJUST AN ERROR LOCATOR POLYNOMIAL BASED ON AN ERROR PARITY" ("the '866 application"). This application is also a continuation-in-part of U.S. Non-provisional application Ser. No. 15/373,313, filed Dec. 8, 2016, which claims priority to and the benefit of the '866 application and U.S. Non-provisional application Ser. No. 14/963,025, filed on Dec. 8, 2015, which claims priority to and the benefit of U.S. Provisional Application No. 62/192,513, filed on Jul. 14, 2015 and entitled, "SYSTEMS AND METHODS FOR PROVIDING LOW LATENCY READ PATH FOR NON-VOLATILE MEMORY". The entire content of each of these applications is incorporated herein by reference.

FIELD OF THE DISCLOSURE

This disclosure is generally related to electronic devices and more particularly to decoders of electronic devices.

BACKGROUND

Data storage devices enable users to store and retrieve data. Examples of data storage devices include volatile memory devices and non-volatile memory devices. A non-volatile memory may retain data after a power-down event, and a volatile memory may lose data after a power-down event.

In some cases, data may be subject to one or more errors. For example, electrical noise may cause a logic "0" value to be read as a logic "1" value (or vice versa). Electrical noise may affect data within an electronic device as well as data that is sent via a network, such as a wireless network or a wired network. For example, a mobile phone may receive data that is affected by a wireless channel used to receive the data.

To enable correction of data errors, an encoder may encode data using an encoding scheme, such as by adding redundancy information to the data prior to storing the data to a memory or prior to transmitting the data. The encoding scheme may specify a codebook that associates data with codewords of the encoding scheme. A decoder may decode the data by using the redundancy information to locate and correct one or more data errors (up to a particular error correction capability of the encoding scheme).

Decoding data consumes power and clock cycles of a device. For example, a decoder may use an iterative decoding process to locate data errors, which utilizes power and one or more clock cycles for each iteration.

DETAILED DESCRIPTION

A device is configured to decode data using a decoding process that includes adjusting a length of an error locator polynomial based on an error parity associated with the data. As an illustrative example, by encoding the data using an "even" codebook that includes codewords each having an even number of logic "1" values, the device may determine whether a sensed representation of the data includes an even number of errors of an odd number of errors (i.e., whether the error parity is odd or even).

The error parity may enable the device to "condense" certain operations of a decoding process. For example, a decoding process may include iteratively adjusting the length of the error locator polynomial and checking whether the adjusted length is "correct" based on syndrome information associated with the data. In this example, the error parity may enable the device to adjust the length of the error locator polynomial by a value of two in some cases. To illustrate, if the length of the error locator polynomial is even (based on the error parity of the data to be decoded), then the device may "skip" adjusting the length to an odd number in some circumstances (e.g., by adjusting the length from a value of two to a value of four, as an illustrative example). Alternatively, if the length of the error locator polynomial is odd (based on the error parity of the data to be decoded), then the device may "skip" adjusting the length to an even number in some circumstances.

Use of the error parity to adjust the length of the error locator polynomial may reduce a number of clock cycles used to decode data. As a result, decoding latency and power consumption may be reduced.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Figure 1:
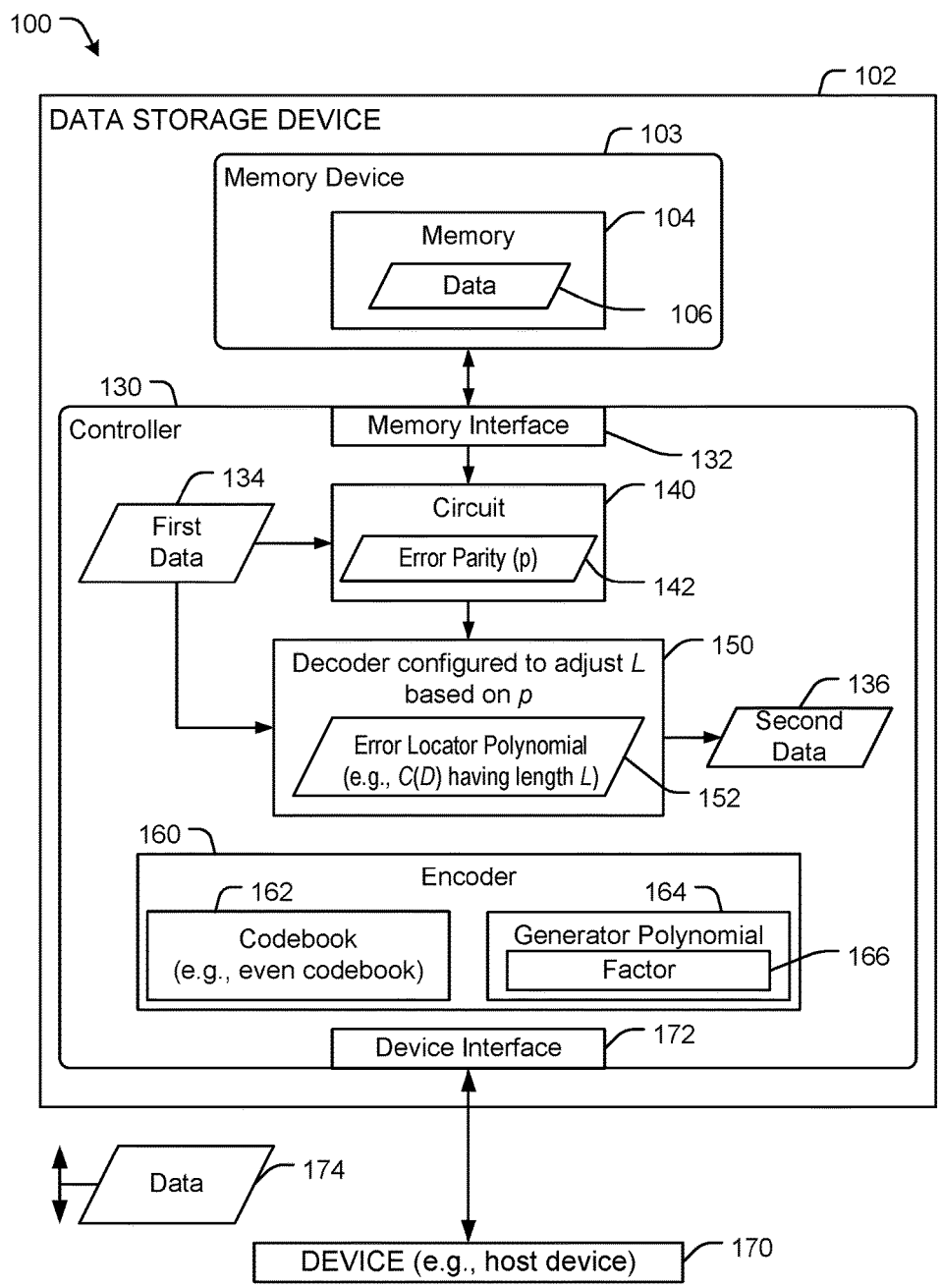
FIG. 1 is a diagram of a particular illustrative example of a system including a data storage device that includes a decoder configured to adjust a length of an error locator polynomial based on an error parity.

Referring to FIG. 1, a particular illustrative example of system is depicted and generally designated 100. The system 100 includes a data storage device 102 (e.g., an apparatus) and a device 170 (e.g., a host device or an access device). The data storage device 102 includes a memory device 103 and a controller 130. The controller 130 is coupled to the memory device 103. In some implementations, the data storage device 102 is integrated within the device 170, such as in connection with a solid-state drive (SSD) implementation.

The memory device 103 includes a memory 104, such as a non-volatile array of storage elements included in one or more memory dies. The memory 104 may include a flash memory (e.g., a NAND flash memory) or a resistive memory, such as a resistive random access memory (ReRAM), as illustrative examples. The memory 104 may have a three-dimensional (3D) memory configuration. As used herein, a 3D memory device may include multiple physical levels of storage elements (instead of having a single physical level of storage elements, as in a planar memory device). As an example, the memory 104 may have a 3D vertical bit line (VBL) configuration. In a particular implementation, the memory 104 is a non-volatile memory having a 3D memory array configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 includes one or more regions of storage elements. An example of a storage region is a block, such as a NAND flash erase group of storage elements, or a group of resistance-based storage elements in a ReRAM implementation. Another example of a storage region is a word line of storage elements (e.g., a word line of NAND flash storage elements or a word line of resistance-based storage elements). A storage region may have a single-level-cell (SLC) configuration, a multi-level-cell (MLC) configuration, or a tri-level-cell (TLC) configuration, as illustrative examples. Each storage element of the memory 104 may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values.

The controller 130 includes a memory interface 132 to the memory device 103 and further includes a device interface 172 to the device 170. The controller 130 also includes a circuit 140 and a decoder 150. The circuit 140 is coupled to the decoder 150. The controller 130 further includes an encoder 160.

The encoder 160 is configured to encode data to generate one or more error correcting code (ECC) codewords using one or more ECC encoding techniques. The encoder 160 may be configured to encode data using an algebraic code. The encoder 160 may include a Reed-Solomon (RS) encoder, a Bose-Chaudhuri-Hocquenghem (BCH) encoder, an encoder configured to encode data according to one or more other ECC techniques, or a combination thereof.

The decoder 150 is configured to decode data read from the memory 104 to detect and correct, up to an error correction capability of the ECC scheme, one or more bit errors that may be present in the data. The decoder 150 may be configured to decode data using an algebraic code. The decoder 150 may include an RS decoder, a BCH decoder, a decoder configured to decode data according to one or more other ECC techniques, or a combination thereof. In some implementations, the decoder 150 is configured to operate in accordance with one or more of a Berlekamp-Massey (BM) technique or a Peterson-Gorenstein-Zierler (PGZ) technique.

During operation, the controller 130 may receive data 174 from the device 170, such as in connection with a request for write access to the memory 104. The controller 130 may input the data 174 to the encoder 160 to generate encoded data, such as data 106. As an illustrative example, the data 174 may be encoded in accordance with a BCH code to generate the data 106.

The data 106 may include one or more codewords associated with a codebook 162 of a particular code (e.g., a BCH code, as an illustrative example) that is used to generate the data 106. In an illustrative example, each codeword indicated by the codebook 162 may include an even number of logic one values (i.e., the codebook 162 may correspond to an "even codebook").

The encoder 160 may be configured to generate a set of codewords each having an even number of logic one values. For example, the encoder 160 may be configured to encode the data 174 using a generator polynomial 164 having a factor 166 selected to cause each codeword of the set of codewords to have an even number of logic one values. To illustrate, the generator polynomial 164 may correspond to g(x)*(1+x), where g(x) is a generator function of a BCH code and (1+x) corresponds to the factor 166.

The controller 130 may be configured to send the data 106 to the memory device 103. The memory device 103 may store the data 106 to a particular region of the memory 104.

The controller 130 may access the data 106 from the memory 104. As an illustrative example, the controller 130 may receive a request for read access to the data 106. The controller 130 may send a read command to the memory device 103 to initiate reading of the data 106. In response to the read command, the memory device 103 may sense the data 106 to generate sensed data, such as first data 134. The first data 134 may differ from the data 106 due to one or more errors. The memory device 103 may provide the first data 134 to the controller 130.

The controller 130 may input the first data 134 to the circuit 140. For example, the circuit 140 may be coupled to the memory interface 132 and may receive the first data 134 from the memory interface 132. The circuit 140 is configured to determine an error parity 142 (also referred to herein as "p") of the first data 134. To illustrate, if the codebook 162 corresponds to an "even" codebook, the circuit 140 may be configured to determine the error parity 142 based on whether the first data 134 indicates an even number of logic one values or an odd number of logic one values.

To further illustrate, the circuit 140 may identify (e.g., count) a number of logic one values included in the first data 134. In this example, the error parity 142 corresponds to a difference between the number of logic one values and a codeword parity that is associated with each codeword of an encoding scheme used to encode the first data 134. In an illustrative implementation, the circuit 140 is configured to set the error parity 142 to a particular logic value (e.g., a logic zero value) in response to determining that the number of logic one values included in the first data 134 is even. In this example, the circuit 140 may be further configured to set the error parity 142 to another logic value (e.g., a logic one value) in response to determining that the number of logic one values included in the first data 134 is odd.

The decoder 150 is configured to receive the first data 134 (e.g., from the circuit 140 or from the memory interface 132). The decoder 150 is further configured to receive an indication of the error parity 142 from the circuit 140. The decoder 150 is configured to decode the first data 134 to generate second data 136. The second data 136 may correspond to the data 174 (e.g., an error-corrected version of the first data 134), as an illustrative example.

The decoder 150 is configured to generate the second data 136 by adjusting an error locator polynomial 152 (also referred to herein as "C(D)") based on the error parity 142 of the first data 134. The error locator polynomial 152 has a length L, such as a positive integer number of coefficients of the error locator polynomial 152, as an illustrative example.

To further illustrate, the decoder 150 may be configured to perform a decoding process that includes one or more iterations to decode the first data 134. The decoding process may include adjusting the length L based on an estimated number of errors of the first data 134, such as by iteratively increasing the length L. After adjusting the length L, the decoder 150 may use the error locator polynomial 152 to correct one or more errors of the first data 134. By accessing the error parity 142, the decoder 150 may omit (or "skip") certain iterations of the decoding process in some cases, such as by skipping adjusting the length of the error locator polynomial 152 to an even value or to an odd value based on the error parity 142 in certain iterations of the decoding process. In this case, the decoder 150 may be configured to adjust the length L by a value of two.

The decoder 150 may be configured to adjust the length L by a particular value based on a comparison of the error parity 142 to a parity of the error locator polynomial 152. For example, the decoder 150 may be configured to increase the length L by a value of two if the error parity 142 is equal to a parity of the error locator polynomial 152. As another example, the decoder 150 may be configured to increase the length L by a value of one if the error parity 142 is not equal to a parity of the error locator polynomial 152.

The decoder 150 may be configured to adjust the length L (e.g., by a value of two or by a value of one) in a single iteration of a decoding process to decode the first data 134. For example, the decoder 150 may be configured to decode the first data 134 in accordance with an improved BM technique to generate the second data 136. In this example, by increasing the length L by a value of two in certain iterations, the decoder 150 may be configured to "condense" operations of two iterations of the BM technique into a single iteration (e.g., to perform the two iterations of an improved BM decoding process in parallel). As another example, the decoder 150 may be configured to decode the first data 134 in accordance with an improved PGZ technique to generate the second data 136.

To further illustrate, the pseudo-code of Example 1 illustrates certain operations that may be performed in connection with an improved BM decoding process. In order to understand the example, it may be beneficial to look first at another version of the BM algorithm for decoding primitive narrow sense BCH codes, as shown in the pseudo-code of Table 1:

TABLE 1

Initialize: C(D)=1, B(D)=1, x=1, L=0, b=1, T=0.
While T < t,
   d = $\Sigma_{i=0}^{L} c_i S_{2T+1-i}$
   If d==0,
     x=x+2
   elseif L > T
     C(D) = bC(D) + dD$^x$ B(D)
     x = x + 2
   else
     tmpC = C(D)
     L = 2T + 1 − L
     C(D) = bC(D) + dD$^x$ B(D)
     B(D) = tmpC
     b = d
     x = 2
   end
   T = T + 1
end In the BM algorithm, for a narrow sense BCH code, each change to the length L of C(D) results in a change of the parity of the length from odd to even or from even to odd. This follows from the equation relating the "new" length (Lnew) to the current length (L): Lnew=2T+1−L.

If the "correct" parity of L is known in advance, and if the length L is updated on two successive iterations, then two iterations may be performed at once, thus reversing the parity twice (or "preserving" the parity of L during the BM algorithm). This may speed up the BM algorithm and may reduce the time for convergence of the algorithm by up to 50%. A condition is that both L≤T and Lnew=2T+1−L≤T+1, which has the solution L=T.

Therefore, if the parity of the length of the "true" C(D) is known in advance, the BM algorithm may be modified to the IBM algorithm as depicted below in example 1. The decoder 150 may be configured to operate in accordance with the pseudo-code of Example 1.

Example 1

```
Initialize: C(D)=1, B(D)=1, x=1, L=0, b=1, T=0, p = parity of
error num
While T < t,
    d = Σ_{i=0}^{L} c_i S_{2T+1-i}
    If d == 0,
        x=x+2; T=T+1
    elseif L > T
        C(D) = bC(D) + dD^x B(D)
        x = x+2; T=T+1
    elseif L==T && parity(L)==p
        e_1 = Σ_{i=0}^{L} c_i S_{2T+3-i}
        e_2 = Σ_{i=0}^{L+1-x} b_i S_{2T+3-i-x}
        tmpC = bC(D) + dD^x B(D)
        L=L+2
        C(D) = (db + (be_1+de_2)D^2)C(D) + d^2 D^x B(D)
        B(D) = tmpC; b=be_1+de_2; x=2; T = T+2
    else
        tmpC = C(D)
        L=2T+1-L
        C(D) = bC(D) + dD^x B(D)
        B(D) = tmpC; b=d; x=2; T = T+1
    end
end
```

In Example 1, C(D) may correspond to the error locator polynomial 152, and D may indicate a variable of the error locator polynomial. L may correspond to the degree of the error locator polynomial 152 (also referred to herein as the length of the error locator polynomial 152), and t may indicate an error correction capability associated with the particular ECC scheme. T may indicate (e.g., track) a number of iterations performed in a particular decoding process, B(D) may indicate a previous estimation of C(D) (e.g., prior to adjusting L), $c_i$ may indicate the i-th coefficient of C(D), $b_i$ may indicate the i-th coefficient of B(D), and $S_i$ may indicate the i-th syndrome.

During a decoding process performed in accordance with Example 1, L may be increased iteratively. In certain iterations, a first iteration and a second iteration may be performed in parallel (instead of performing the first iteration and then checking whether convergence is satisfied or if the conditions for performing the second iteration are satisfied). In this case, L may be increased by two (i.e., L=L+2). These iterations occur if the error parity p corresponds to the current estimated degree L of C(D) (i.e., if parity(L)==p) and if the iteration number T is equal to the degree L. In this case, two iterations of the decoding process may be "condensed" into a single iteration and L may be incremented by two.

By "condensing" operations of two iterations of a decoding process into a single iteration, data may be decoded more quickly. As a result, performance of the data storage device 102 may be improved.

Figure 2:
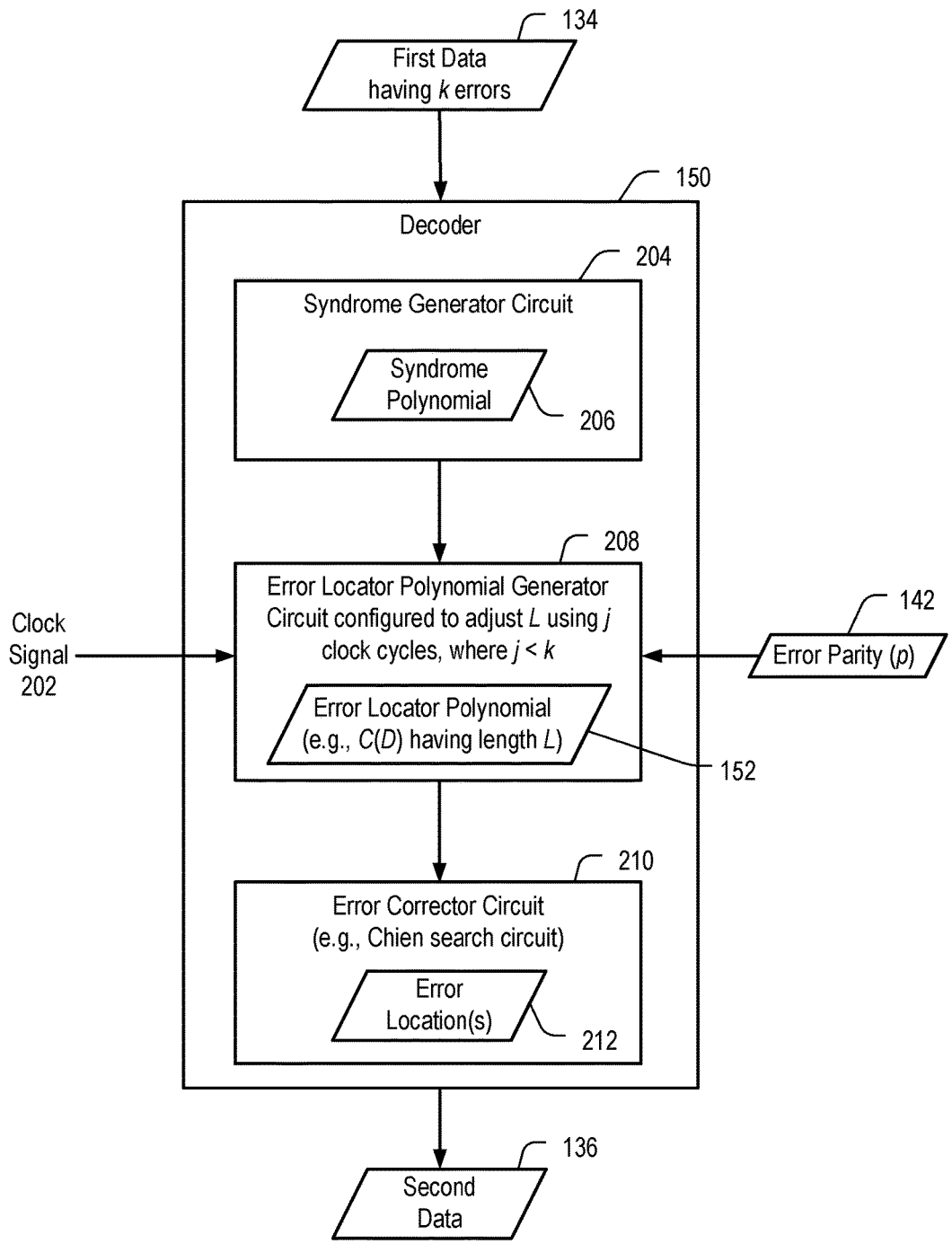
FIG. 2 is a diagram illustrating aspects of a particular example of the decoder of FIG. 1.

FIG. 2 illustrates certain aspects of an illustrative example of the decoder 150 of FIG. 1. In the example of FIG. 2, the decoder 150 includes a syndrome generator circuit 204, an error locator polynomial generator circuit 208, and an error corrector circuit 210. The syndrome generator circuit 204 is coupled to the error locator polynomial generator circuit 208, and the error locator polynomial generator circuit 208 is coupled to the error corrector circuit 210.

During operation, the syndrome generator circuit 204 may receive the first data 134. The first data 134 may include k errors (where k is a positive integer number). The syndrome generator circuit 204 may be configured to generate a syndrome polynomial 206 based on the first data 134.

The error locator polynomial generator circuit 208 may be configured to receive the syndrome polynomial 206, an indication of the error parity 142, and a clock signal 202. The error locator polynomial generator circuit 208 may be configured to generate the error locator polynomial 152 based on the syndrome polynomial 206 and to adjust the length L of the error locator polynomial 152 based on the error parity 142.

The error locator polynomial generator circuit 208 may be configured to perform operations based on the clock signal 202. For example, one iteration of the while loop of Example 1 may be performed during each cycle of the clock signal 202. Generating the error locator polynomial 152 and adjusting the length L of the error locator polynomial 152 may thus be performed based on the clock signal 202. The error locator polynomial generator circuit 208 may be configured to adjust coefficients of the error locator polynomial 152 based on the syndrome polynomial 206 and based on the clock signal 202. The error locator polynomial generator circuit 208 may be configured to adjust the length L of the error locator polynomial 152 until determining that the length L is "correct" based on the syndrome polynomial 206. For example, the error locator polynomial generator circuit 208 may be configured to determine that the error locator polynomial 152 is "correct" based on a product of the error locator polynomial 152 and the syndrome polynomial 206. After adjusting the error locator polynomial 152, the error locator polynomial generator circuit 208 may provide the error locator polynomial 152 to the error corrector circuit 210.

In the example of FIG. 2, the error locator polynomial generator circuit 208 is configured to generate the error locator polynomial 152 using j clock cycles of the clock signal 202 (where j is a positive integer number). The number of clock cycles j is less than the number of errors k of the first data 134 (i.e., j<k). For example, by "condensing" at least two iterations of a decoding process performed by the decoder 150 into one clock cycle of the clock signal 202, k errors of the first data 134 may be corrected using j clock cycles. In some examples, the number of clock cycles (j) is less than three-fourths of the number of errors (k) of the first data 134. In another example, the number of clock cycles (j) is approximately half of the number of errors (k) of the first data 134. In other examples, j and k may have a different relation.

The error corrector circuit 210 may be configured to determine one or more error locations 212 of the first data 134 based on the error locator polynomial 152. For example, the error corrector circuit 210 may include a Chien search circuit configured to perform a Chien search of the error locator polynomial 152 to determine the one or more error locations 212 of the first data 134. In an illustrative example, the error corrector circuit 210 is configured to determine the one or more error locations 212 by determining a set of roots of the error locator polynomial 152. In certain cases (e.g., if L≤4), then the roots of the error locator polynomial 152 may be solved for analytically (e.g., instead of using a Chien search).

The error corrector circuit 210 may be configured to adjust values of the first data 134 based on the one or more error locations 212 to generate the second data 136. For example, the error corrector circuit 210 may "flip" one or more bits of the first data 134 based on the one or more error locations 212 to generate the second data 136. The second data 136 may correspond to the data 174 of FIG. 1, as an illustrative example.

The example of FIG. 2 illustrates that in some cases the error locator polynomial generator circuit 208 may generate the error locator polynomial 152 using j clock cycles of the clock signal 202. In the example of FIG. 2, j is less than the number of errors k of the first data 134. Because j<k, performance of the decoder 150 may be improved as compared to a device that uses at least one clock cycle for each error to generate an error locator polynomial.

Figure 3:
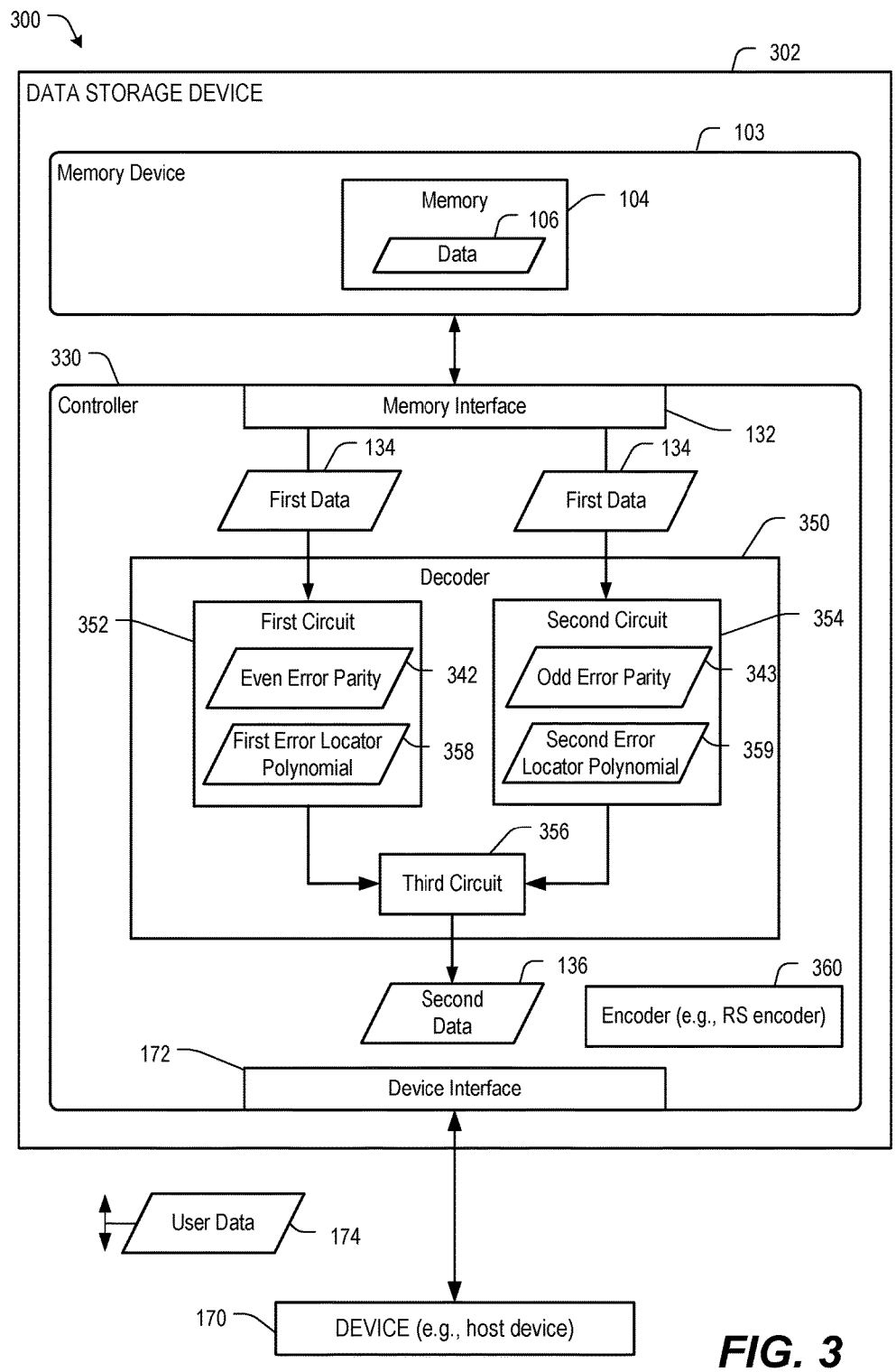
FIG. 3 is a diagram of a particular illustrative example of a system including a data storage device that includes a decoder configured to adjust a length of a first error locator polynomial based on an even error parity and to adjust a length of a second error locator polynomial based on an odd error parity.

Referring to FIG. 3, a particular illustrative example of system is depicted and generally designated 300. The system 300 includes a data storage device 302 (e.g., an apparatus) and the device 170 (e.g., a host device or an access device). The data storage device 302 includes the memory device 103 and a controller 330. The controller 330 is coupled to the memory device 103. In some implementations, the data storage device 302 is integrated within the device 170, such as in connection with an SSD implementation. The memory device 103 includes the memory 104.

The controller 330 includes the memory interface 132 to the memory device 103 and further includes the device interface 172 to the device 170. The controller 330 also includes a decoder 350 and an encoder 360. The decoder 350 includes a first circuit 352, a second circuit 354, and a third circuit 356 coupled to the first circuit 352 and to the second circuit 354. In some implementations, the decoder 350 further includes the syndrome generator circuit 204 and the error corrector circuit 210 of FIG. 2. The first circuit 352 and the second circuit 354 each include a circuit corresponding to error locator polynomial generator circuit 208 of FIG. 2.

The encoder 360 is configured to encode data to generate one or more ECC codewords using one or more ECC encoding techniques. The encoder 360 may include an RS encoder, a BCH encoder, an encoder configured to encode data according to one or more other ECC techniques, or a combination thereof.

The decoder 350 is configured to decode data read from the memory 104 to detect and correct, up to an error correction capability of the ECC scheme, one or more bit errors that may be present in the data. The decoder 350 may include an RS decoder, a BCH decoder, a decoder configured to decode data according to one or more other ECC techniques, or a combination thereof.

The circuits 352, 354 may be configured to perform certain operations in parallel. To illustrate, the decoder 350 may be configured to perform multiple iterations of a BM decoding process in parallel using the circuits 352, 354.

During operation, the controller 330 may receive the data 174 from the device 170, such as in connection with a request for write access to the memory 104. The controller 330 may input the data 174 to the encoder 360 to generate encoded data, such as the data 106. As an illustrative example, the data 174 may be encoded in accordance with an RS code or in accordance with a BCH code to generate the data 106.

The controller 330 may be configured to send the data 106 to the memory device 103. The memory device 103 may store the data 106 to a particular region of the memory 104.

The controller 330 may access the data 106 from the memory 104. As an illustrative example, the controller 330 may receive a request for read access to the data 106. The controller 330 may send a read command to the memory device 103 to initiate reading of the data 106. In response to the read command, the memory device 103 may sense the data 106 to generate sensed data, such as first data 134. The first data 134 may differ from the data 106 due to one or more errors. The first data 134 may include a set of symbols (or a representation of the symbols) encoded in accordance with an RS code or a BCH code, as illustrative examples. The memory device 103 may provide the first data 134 to the controller 330.

The controller 330 may input the first data 134 to the first circuit 352 and to the second circuit 354. In an illustrative example, the controller 330 is configured to input the first data 134 to the first circuit 352 and to the second circuit 354 in parallel (e.g., during a common clock cycle of a clock signal used by the controller 330).

The decoder 150 may be configured to determine a syndrome polynomial based on the first data 134. For example, the decoder 350 may include the syndrome generator circuit 204 of FIG. 2. The first circuit 352 may be coupled to receive the syndrome polynomial 206 of FIG. 2. The second circuit 354 may also be coupled to receive the syndrome polynomial 206 of FIG. 2.

In some examples, the first data 134 includes a set of symbols (e.g., in accordance with a non-binary encoding technique that uses symbols to represent data). In some circumstances, determining an error parity associated with a set of symbols may be inefficient or infeasible. The decoder 350 may be configured to separately "assume" both an even error parity and an odd parity of the first data 134 and to perform operations based on the even error parity and the odd error parity in parallel.

The first circuit 352 is configured to receive the first data 134 and to perform a set of decoding operations based on the first data 134 by adjusting a first error locator polynomial 358 based on an even error parity of the first data 134. In the example of FIG. 3, instead of determining the error parity 142 as described with reference to FIGS. 1 and 2, the first circuit 352 may "assume" that an error parity of the first data 134 is even (e.g., based on an even error parity 342 of the first data 134). The first circuit 352 may adjust a length L of the first error locator polynomial 358 as described with reference to FIG. 1 based on the even error parity 342 (e.g., instead of using the error parity 142 of FIG. 1).

The second circuit 354 is configured to receive the first data 134 and to perform the set of decoding operations (e.g., a set of decoding operations performed in accordance with a BM decoding technique, as an illustrative example) by adjusting a second error locator polynomial 359 based on an odd error parity of the first data 134. In the example of FIG. 3, instead of determining the error parity 142 using the circuit 140 as described with reference to FIGS. 1 and 2, the second circuit 354 may "assume" that an error parity of the first data 134 is odd (e.g., based on an odd error parity 343 of the first data 134). The second circuit 354 may adjust a length L of the second error locator polynomial 359 as described with reference to FIG. 1 based on the odd error parity 343 (e.g., instead of using the error parity 142 of FIG. 1).

The third circuit 356 is configured to select an output of the first circuit 352 or the second circuit 354. For example, the first circuit 352 may be configured to provide the first error locator polynomial 358 to the third circuit 356, and the second circuit 354 may be configured to provide the second error locator polynomial 359 to the third circuit 356. The third circuit 356 may be configured to select either the first error locator polynomial 358 or the second error locator polynomial 359 based on whether the "correct" parity of the first data 134 is even or odd. For example, the third circuit 356 may be configured to select the output of the first circuit 352 or the second circuit 354 in response to detecting that the output satisfies convergence criteria associated with a code (e.g., an RS code or a BCH code) associated with the first data 134. Determining whether the convergence criteria are satisfied may include determining which of the error locator polynomials 358, 359 corresponds to the syndrome polynomial 206 of FIG. 2. The output of the first circuit 352 may satisfy the convergence criteria if the "correct" parity of the first data 134 is even, and the output of the second circuit 354 may satisfy the convergence criteria if the "correct" parity of the first data 134 is odd.

In some implementations, the third circuit 356 may include a comparator circuit and a multiplexer (MUX) circuit coupled to the comparator circuit. The comparator circuit may be configured to determine which of the first error locator polynomial 358 and the second error locator polynomial 359 satisfies the convergence criteria. The comparator circuit may be configured to provide a signal to the MUX circuit. The signal may have one of a first value to indicate that the first error locator polynomial 358 satisfies the convergence criteria or a second value to indicate that the second error locator polynomial 359 satisfies the convergence criteria. The MUX circuit may select the first error locator polynomial 358 or the second error locator polynomial 359 based on the signal.

The third circuit 356 may be configured to perform decoding of the first data 134 based on the selected output of the circuits 352, 354 (i.e., based on the first error locator polynomial 358 or the second error locator polynomial 359). For example, the third circuit 356 may include the error corrector circuit 210 of FIG. 2. In this example, the error corrector circuit 210 may be configured to receive the selected output (i.e., the first error locator polynomial 358 or the second error locator polynomial 359) and to identify the one or more error locations 212 of FIG. 2 based on the selected output. The error corrector circuit 210 may be configured to correct one or more errors of the first data 134 based on the one or more error locations 212 of FIG. 2 to generate the second data 136.

By determining the error locator polynomials 358, 359 in parallel using the circuits 352, 354, the decoder 350 may reduce a number of clock cycles associated with determining error locator information. Such a technique may be used to improve performance in certain applications, such as in connection with a non-binary encoding technique that uses symbols to represent data, in which case determining the error parity 142 of FIG. 1 may be inefficient or infeasible.

Figure 4:
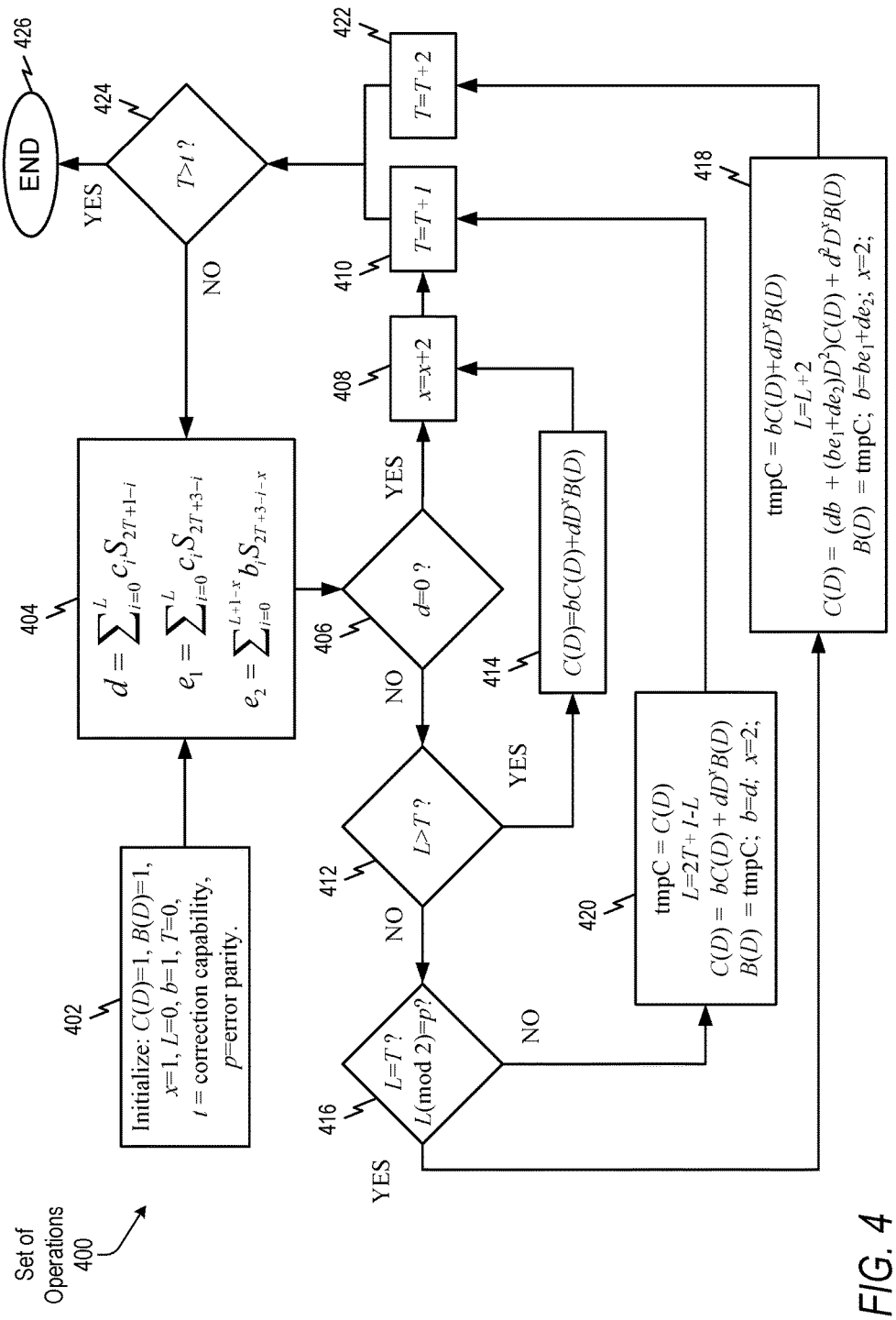
FIG. 4 is a flow chart of a particular illustrative example of a set of operations that may be performed by a decoder, such as one or more of the decoders of FIGS. 1-3.

FIG. 4 is a flow chart of an illustrative example of a set of operations 400. One or more operations of the set of operations 400 may be performed at the decoder 150, at the decoder 350, or a combination thereof. The set of operations 400 may correspond to operations indicated by the pseudocode of Example 1.

The operations 400 include an initialization operation, at 402. The initialization operation may include setting C(D), B(D), x, and b to one and setting L and T to zero. The initialization operation may include setting p to a value of the error parity 142 (e.g., to zero if the first data 134 has an even number of "1" values or to one if the first data 134 has an odd number of "1" values, as an illustrative example). In another example, the initialization operation may include setting p to a value of the even error parity 342 (e.g., by the first circuit 352) or setting p to a value of the odd error parity 343 (e.g., by the second circuit 354).

The operations 400 further include a set of summation operations, at 404. The set of summation operations may include determining d, $e_1$, and $e_2$.

At 406, a determination is made whether d=0. If d=0, then the set of operations further includes increasing x by two (x=x+2), at 408, and increasing T (the iteration counter) by one (T=T+1), at 410. Otherwise, a determination is made whether L>T, at 412.

If L>T, the operations 400 further include adjusting C(D) based on $C(D)=bC(D)+dD^xB(D)$, at 414. Otherwise, a determination is made whether the current degree L of the locator polynomial is equal to the iteration counter T (L=T) and whether the parity of L is equal to the parity of the errors (L(mod 2)=p), at 416.

If L=T and L(mod 2)=p, the operations 400 further include a first set of operations, at 418. The first set of operations may correspond to a "dual-iteration" of a BM decoding process where L is increased by two. In this case, the operations 400 further include increasing T by two, at 422 (e.g., to indicate that operations of two iterations have been performed).

Otherwise, the operations 400 further include a second set of operations, at 420. The second set of operations may correspond to a "single iteration" of a BM decoding process where L is incremented by one. In this case, the operations 400 further include increasing T by two, at 410 (e.g., to indicate that operations of two iterations have been performed).

A determination may be made whether the iteration counter is greater than the error correction capability (T>t), at 424. If T≤t, the operations 400 may continue by performing the set of summation operations, at 404. Otherwise, if T>t, the operations 400 may end, at 426.

Figure 5:
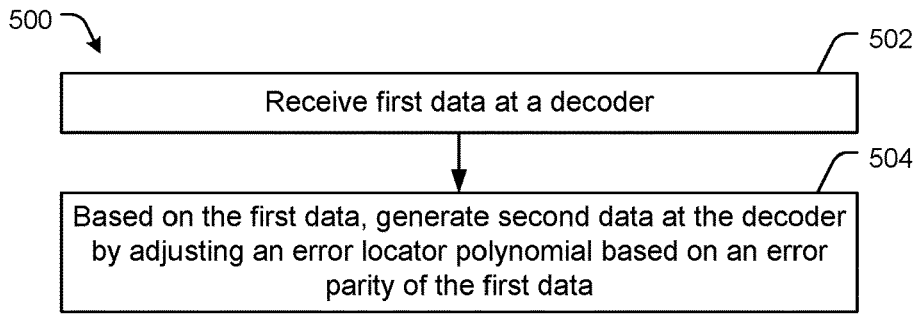
FIG. 5 is a flow chart of a particular illustrative example of a method of operation of a decoder, such as the decoder of FIG. 1, the decoder of FIG. 2, or both.

Referring to FIG. 5, an illustrative example of a method is depicted and generally designated 500. The method 500 may be performed by a decoder, such as the decoder 150, as an illustrative example.

The method 500 includes receiving first data at the decoder, at 502. For example, the decoder 150 may receive the first data 134.

The method 500 further includes generating second data at the decoder based on the first data, at 504. Generating the second data includes adjusting an error locator polynomial based on an error parity of the first data. To illustrate, the decoder 150 may generate the second data 136 by adjusting the length L of the error locator polynomial 152 based on the error parity 142.

Figure 6:
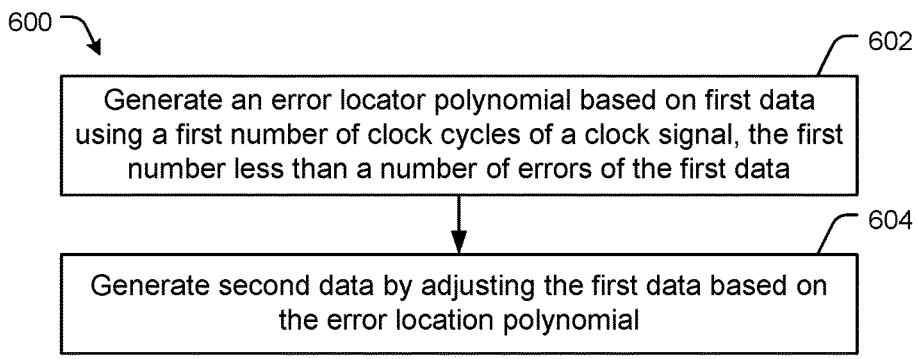
FIG. 6 is a flow chart of another particular illustrative example of a method of operation of a decoder, such as the decoder of FIG. 1, the decoder of FIG. 2, or both.

Referring to FIG. 6, another illustrative example of a method is depicted and generally designated 600. The method 600 may be performed by a decoder, such as the decoder 150, as an illustrative example.

The method 600 includes generating an error locator polynomial based on first data using a first number of clock cycles of a clock signal, at 602. The first number is less than a number of errors of the first data. To illustrate, the first data 134 may include k errors, and the decoder 150 may generate the error locator polynomial 152 using j clock cycles of the clock signal 202, where j<k.

The method 600 further includes generating second data by adjusting the first data based on the error locator polynomial, at 604. As an illustrative example, the error corrector circuit 210 may identify the one or more error locations 212 based on the error locator polynomial 152, and the decoder 150 may adjust values of the first data 134 based on the one or more error locations 212 to generate the second data 136.

Figure 7:
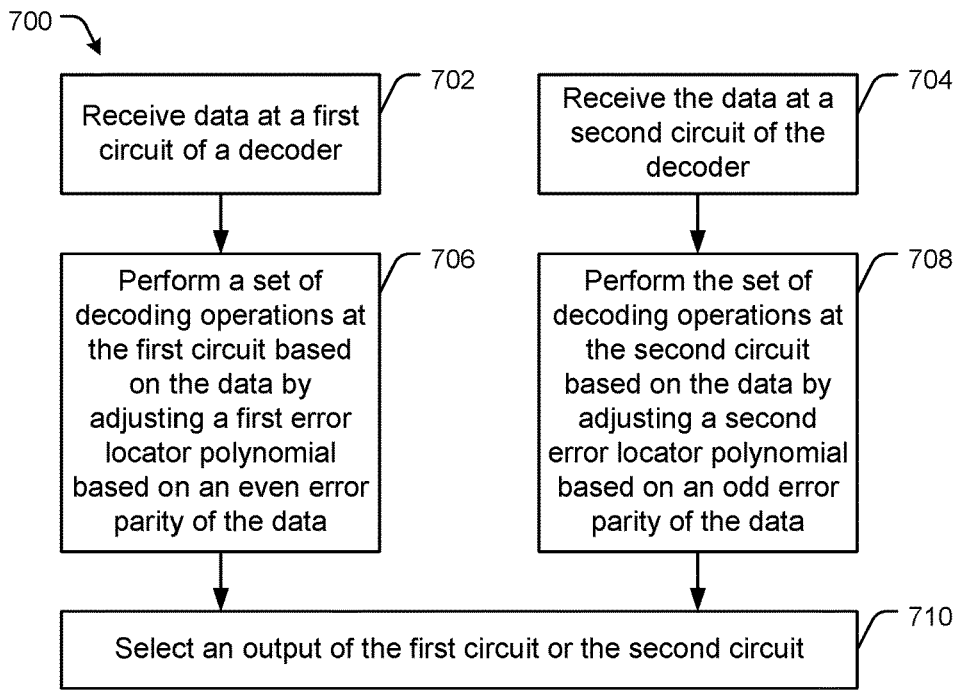
FIG. 7 is a flow chart of another particular illustrative example of a method of operation of a decoder, such as the decoder of FIG. 3.

Referring to FIG. 7, another illustrative example of a method is depicted and generally designated 700. The method 700 may be performed by a decoder, such as the decoder 350, as an illustrative example.

The method 700 includes receiving data at a first circuit of the decoder, at 702, and receiving the data at a second circuit of the decoder, at 704. For example, the first circuit 352 and the second circuit 354 may receive the first data 134. In an illustrative example, the first circuit 352 and the second circuit 354 receive the first data 134 in parallel (e.g., during a common clock cycle).

The method 700 further includes performing a set of decoding operations at the first circuit based on the data by adjusting a first error locator polynomial based on an even error parity of the data, at 706. As an illustrative example, the first circuit 352 may adjust a length of the first error locator polynomial 358 based on the even error parity 342.

The method 700 further includes performing the set of decoding operations at the second circuit based on the data by adjusting a second error locator polynomial based on an odd error parity of the data, at 708. As an illustrative example, the second circuit 354 may adjust a length of the second error locator polynomial 359 based on the odd error parity 343.

In an illustrative example, the first circuit 352 performs the set of decoding operations in parallel with the set of decoding operations performed by the second circuit 354 (e.g., during a common set of clock cycles). The set of decoding operations may include one or more operations described with reference to the pseudo-code of Example 1, one or more operations of the set of operations 400 of FIG. 4, or a combination thereof, as an illustrative example.

The method 700 further includes selecting an output of the first circuit or the second circuit, at 710. For example, the third circuit 356 may select the first error locator polynomial 358 or the second error locator polynomial 359 as the output.

Overall latency at a decoder that uses an iterative error locator polynomial generation technique may be improved by determining a fast termination condition in parallel. For example, with reference to Table 1 and Example 1 described above in conjunction with the Berlekamp-Massey or the Improved Berlekamp-Massey techniques, each iteration of error locator polynomial generation evaluates d= $\Sigma_{i=0}^{L} c_i S_{2T+i}$, and does not alter the current value of the error location polynomial C(D) if d=0. The condition d=0 may be typically satisfied once the error locator polynomial has converged to its final value. Further checking is performed to verify that the error locator polynomial has converged by checking that d continues to evaluate to 0 for each remaining iteration (e.g., until T>=t).

However, evaluation of d for the current value of the error location polynomial is based solely on the loop variable T, the polynomial length L, the polynomial coefficients $c_i$, and the syndromes $S_i$, all of which are known for the current value of the error location polynomial during each iteration. Therefore, computation of d for all remaining values of T may be performed in parallel, so that convergence or non-convergence of the error locator polynomial at any particular iteration may be determined during a single decoding clock cycle. Convergence of the error locator polynomial may be detected prior to completion of the iterations described in Table 1 and Example 1, enabling fast termination of the error locator polynomial generation and reduced average decoding latency, as described further in the example of FIG. 8.

Example 2 illustrates a modification of the pseudo-code of Table 1 to include fast convergence detection, and Example 3 illustrates a modification of the pseudo-code of Example 1 to include fast convergence detection.

Example 2

```
Initialize: C(D)=1, B(D)=1, x=1, L=0, b=1, T=0.
While T < t,
    Compute d_j = Σ_{i=0}^L c_i S_{2j+1-i} for all j in the range T≤j<t
    If all the d_j values are equal to 0,
        C(D) is unchanged for all remaining iterations, convergence
        detected, terminate and output C(D)
    end
    If d_T==0,
        x=x+2
    elseif L > T
        C(D) = bC(D) + d_T D^x B(D)
        x = x + 2
    else
        tmpC = C(D)
        L = 2T +1 - L
        C(D) = bC(D) + d_T D^x B(D)
        B(D) = tmpC
        b = d_T
        x = 2
    end
    T = T + 1
end
```

Example 3

```
Initialize: C(D)=1, B(D)=1, x=1, L=0, b=1, T=0, p = parity of
    error num
While T < t,
    Compute d_j = Σ_{i=0}^L c_i S_{2j+1-i} for all j in the range T≤j<t
    If all the d_j values are equal to 0,
        C(D) is unchanged for all remaining iterations,
        convergence is detected, terminate and output C(D)
    end
    If d_T == 0,
        x=x+2; T=T+1
    elseif L > T
        C(D) = bC(D) + d_T D^x B(D)
        x = x+2; T=T+1
    elseif L==T && parity(L)==p
        e_1 = Σ_{i=0}^L c_i S_{2T+3-1}
        e_2 = Σ_{i=0}^{L+1-x} b_i S_{2T+3-i-x}
        tmpC = bC(D) + d_T D^x B(D)
        L=L+2
        C(D) = (d_T b + (be_1+d_T e_2)D^2)C(D) + (d_T)^2 D^x B(D)
        B(D) = tmpC; b=be_1+d_T e_2; x=2; T = T+2
    else
        tmpC = C(D)
        L=2T+1-L
        C(D) = bC(D) + d_T D^x B(D)
        B(D) = tmpC; b=d_T; x=2; T = T+1
    end
end
```

In Examples 2 and 3, a convergence condition test has been added that calculates, during each iteration T, all $d_j$ from j=T (the current iteration) to j=t−1 (the final scheduled iteration) to see if any changes to C(D) will occur in any remaining iteration. If all values of $d_j$ are zero, convergence is detected.

Figure 8:
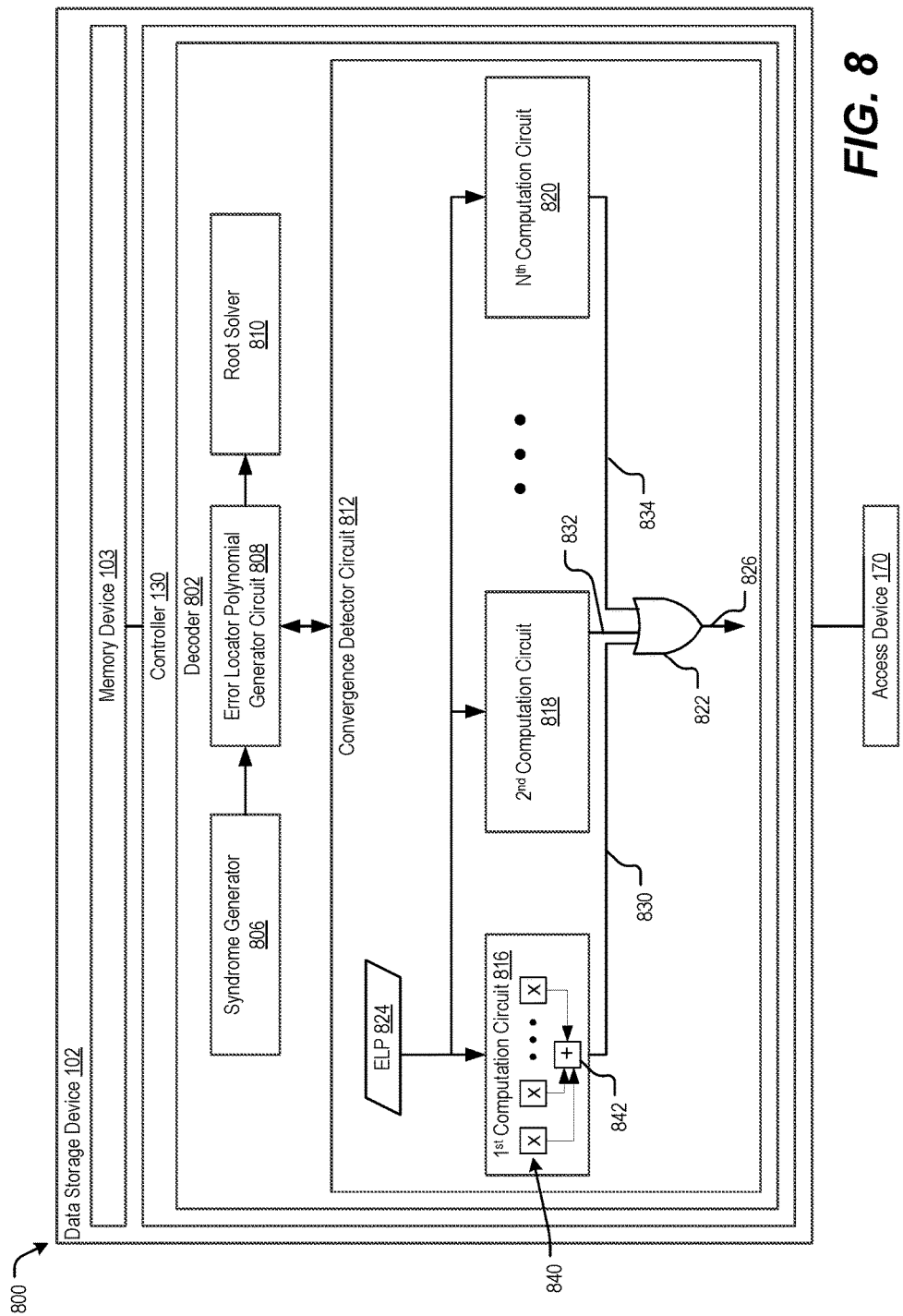
FIG. 8 is a block diagram of a particular illustrative example of a system including a data storage device that includes a decoder with a fast error locator polynomial convergence detector.

Referring to FIG. 8, a particular implementation of a system 800 is illustrated that includes the data storage device 102 coupled to the access device 170. The data storage device 102 includes the memory device 103 coupled to the controller 130. The controller 130 includes a decoder 802 that includes one or more components configured to perform functions associated with decoding data retrieved from the memory device 103. For example, the decoder 802 may include a BCH decoder that has a syndrome generator 806, an error locator polynomial generator circuit 808, and a root solver 810. The decoder 802 further includes a convergence detector circuit 812 coupled to the error locator polynomial generator circuit 808. The convergence detector circuit 812 is configured to determine a fast convergence of an error locator polynomial (ELP) to accelerate decoding of data read from the memory device 103.

The syndrome generator 806 may be configured to process data read from the memory device 103 and to generate a set of syndromes corresponding to the received data. The set of syndromes may be provided to the error locator polynomial generator circuit 808. The error locator polynomial generator circuit 808 may be configured to perform an iterative process to generate an error locator polynomial. For example, the error locator polynomial generator circuit 808 may be configured to generate the error locator polynomial according to a Berlekamp-Massey (BM) technique, such as described with reference to Table 1. Alternatively, the error locator polynomial generator circuit 808 may perform a modified BM technique, such as described with reference to Example 1. Upon completion of generation of an error locator polynomial, the error locator polynomial generator circuit 808 may be configured to provide the error locator polynomial (or data corresponding to the error locator polynomial) to the root solver 810.

The root solver 810 may be configured to perform one or more search processes to determine roots of the error locator polynomial. For example, the root solver 810 may perform a Chien search to locate roots of the error locator polynomial. The decoder 802 may be configured to modify data read from the memory device 103 based on error location values indicated by the root solver 810 to generate error-corrected data to be provided to the access device 170.

The convergence detector circuit 812 includes at least two parallel computation circuits including a first computation circuit 816 and a second computation circuit 818 in parallel with the first computation circuit 816. The multiple computation circuits may also include one or more other computation circuits, up to an $N^{th}$ computation circuit 820, in parallel with the first computation circuit 816 and the second computation circuit 818.

Each of the N computation circuits 816-820 may be configured to generate a respective convergence signal based on an error locator polynomial (ELP) 824 from the error locator polynomial generator circuit 808. For example, the first computation circuit 816 may be configured to generate a first convergence signal 830 based on the ELP 824. The first convergence signal 830 may correspond to a first iteration of the error locator polynomial generator circuit 808. Similarly, the second computation circuit 818 may be configured to generate, in parallel with generation of the first convergence signal 830 by the first computation circuit 816, a second convergence signal 832 based on the ELP 824 and corresponding to a second iteration of the error locator polynomial generator circuit 808. Because each of the computation circuits 816-820 uses the same ELP 824 to generate its respective convergence signal, the ELP 824 may be referred to as a "mutual" error locator polynomial. Although each of the computation circuits 816-820 uses the same error locator polynomial, each of the computation circuits 816-820 uses a different set of syndromes than each of the other computation circuits 816-820 to compute its respective convergence signal, as explained in further detail below.

The evaluation circuitry 822 may include a comparator, such as an adder or a logical OR gate. The evaluation circuitry 822 is coupled to the multiple computation circuits 816-820 and is configured to generate an indicator 826 (e.g., a convergence indicator or a non-convergence indicator) indicating whether a fast convergence condition has been detected. For example, the evaluation circuitry 822 may be configured to generate a non-convergence indicator in response to receiving a convergence signal indicating non-convergence (e.g., one or more of the signals 830-834) from at least one of the multiple computation circuits 816-820. The indicator 826 may be provided to the error locator polynomial generator circuit 808 to indicate whether convergence has been detected, such as via an interrupt signal that causes the error locator polynomial generator circuit 808 to halt processing and to provide the current version of the ELP 824 to the root solver 810.

Each of the computation circuits 816-820 may include a plurality of multipliers and an adder, such as a representative plurality of multipliers 840 and adder 842 of the first computation circuit 816. Each multiplier of the plurality of multipliers 840 may be configured to multiply a syndrome value with a coefficient of the ELP 824, and the adder 842 may have inputs coupled to outputs of the plurality of multipliers 840. For example, the plurality of multipliers 840 and the adder 842 may be configured to perform the computation $d=\Sigma_{i=0}^{L} c_i S_{2T+1-i}$ as in Table 1 or Example 1 (e.g., the plurality of multipliers 840 may include L+1 multipliers, each configured to multiply a respective coefficient $c_i$ of the ELP 824 with a corresponding syndrome $S_{2T+1-i}$). The first convergence signal 830 may have a logical "0" to indicate that d equals 0 (e.g., indicating possible convergence), or may have a logical "1" value to indicate that d does not equal 0 (e.g., indicating non-convergence).

The convergence detector circuit 812 may configure each of the computation circuits 816-820 to perform the computation $d_j=\Sigma_{i=0}^{L} c_i S_{2j+1-i}$ corresponding to a different iteration of the error locator polynomial generator circuit 808 (e.g., each of the computation circuits 816-820 is assigned a value of j and computes a corresponding value of $d_j$ as described in the pseudo-code of Example 2 or Example 3. For example, during a first sequential iteration of the error locator polynomial generator circuit 808 (e.g., T=0 as in Table 1 or Example 1), the convergence detector circuit 812 may receive the ELP 824 for the first iteration and the first computation circuit 816 may perform the computation of d for the first value of j (i.e., j=T=0), the second computation circuit 818 may perform the computation of d for the second value of j (i.e., j=1), and the Nth computation circuit 820 may perform the computation for the $(t-1)^{th}$ value of j (i.e., j=t-1), so that calculations of d for all the possible values of j of the error locator polynomial generator circuit 808 (i.e., for j=0 to j=t-1) are performed in parallel during a single clock cycle for the ELP 824 from the first iteration.

Although each of the computation circuits 816-820 may use the same set of ELP coefficients $\{c_0, c_1, \ldots, c_L\}$, each of the computation circuits 816-820 may use a different set of the syndrome values. For example, when L=1, the first computation circuit 816 may use the set of syndromes $\{S_0, S_1\}$ for j=0, the second computation circuit 818 may use a different set of syndromes $\{S_2, S_3\}$ for j=1, and the Nth computation circuit 820 may also use a different set of syndromes $\{S_{2t-2}, S_{2t-1}\}$ for j=(t-1). Thus, the convergence detector circuit 812 includes at least two computation circuits (e.g., computation circuit 816 and computation circuit 818) configured to generate at least two convergence signals (e.g., signals 830, 832) based on the same set of ELP coefficients e.g., ($\{c_0, c_1, \ldots, c_L\}$) and based on at least two different sets of syndromes (e.g., $\{S_0, S_1\}$ and $\{S_2, S_3\}$). Each of the different sets of syndromes corresponds to a different one of the convergence signals (e.g., when the first computation circuit 816 uses {$S_0$, $S_1$} during generation of the signal 830, the set of syndromes {$S_0$, $S_1$} corresponds to the signal 830; when the second computation circuit 818 uses set of syndromes {$S_2$, $S_3$} during generation of the signal 832, the set of syndromes {$S_2$, $S_3$} corresponds to the signal 832).

If all of the parallel computations of d equal 0, then the ELP 824 of the first iteration has a converged value and no further iterations of the error locator polynomial generator circuit 808 are needed. Otherwise, a second sequential iteration of the error locator polynomial generator circuit 808 may be performed (e.g., for T=1), a value of the ELP 824 for the second iteration may be received at the convergence detector circuit 812, and the first computation circuit 816 may perform the computation of d for the first value of j i.e. j=T=1, the second computation circuit 818 may perform the computation of d for the second value of j (i.e., j=2), and the (N−1)th computation circuit may perform the computation for the $(t-1)^{th}$ value of j (i.e., j=t−1). Calculations of d for all remaining iterations of the error locator polynomial generator circuit 808 (i.e., for T=1 to T=t−1) are performed in parallel during the second clock cycle. Processing may continue for each sequential iteration of the error locator polynomial generator circuit 808 until convergence is detected (or until the process terminates at iteration T>=t without converging).

As described above, the convergence detector circuit 812 may include a sufficient number N of the computation circuits 816-820 to enable a fully parallel convergence detection operation to complete in a single clock cycle. For example, the number N of computation circuits 816-820 may substantially match "t", the largest number of errors that are correctable by the ECC scheme. To illustrate, N may equal t or t−1 in a particular implementation. However, in other implementations with relaxed latency criteria, a slower convergence detection (e.g., 2 or more clock cycles to detect convergence instead of a single clock cycle) may be attained with reduced hardware footprint and reduced cost by reducing the number N of computation circuits to be less than the largest correctable number of errors. For example, N may equal t/2, and convergence verification may be performed in two clock cycles. As another example, N may equal 2, and convergence verification may be performed in t/2 clock cycles. In implementations using multi-clock cycle verification, it should be noted that although multiple clock cycles may be required to detect convergence, non-convergence may be detected in a single clock cycle (e.g., in response to any of the computation circuits 816-820 indicating a non-zero value of d).

In addition, as the number of iterations that have already been performed increases, the number of individual d computations that remain to verify convergence decreases. In an implementation where N equals t/2, 2-clock cycle convergence verification may be performed for iterations of the first t/2 iterations (e.g., T<t/2), and 1-clock cycle convergence verification may be performed for each of the last t/2 iterations (e.g., t/2<T<t).

Average decoding latency may also be improved using a decoding architecture that includes multiple parallel decoding paths, including one path that performs direct computation of error locations for a relatively small number of errors in parallel with another path that performs an iterative locator error polynomial generator for larger numbers of errors. An example of such an architecture that uses the modified BM technique to reduce iterations of the error polynomial generator is depicted in FIG. 9, and FIG. 10 depicts a second example that includes a convergence detector circuit such as described with reference to FIG. 8.

Figure 9:
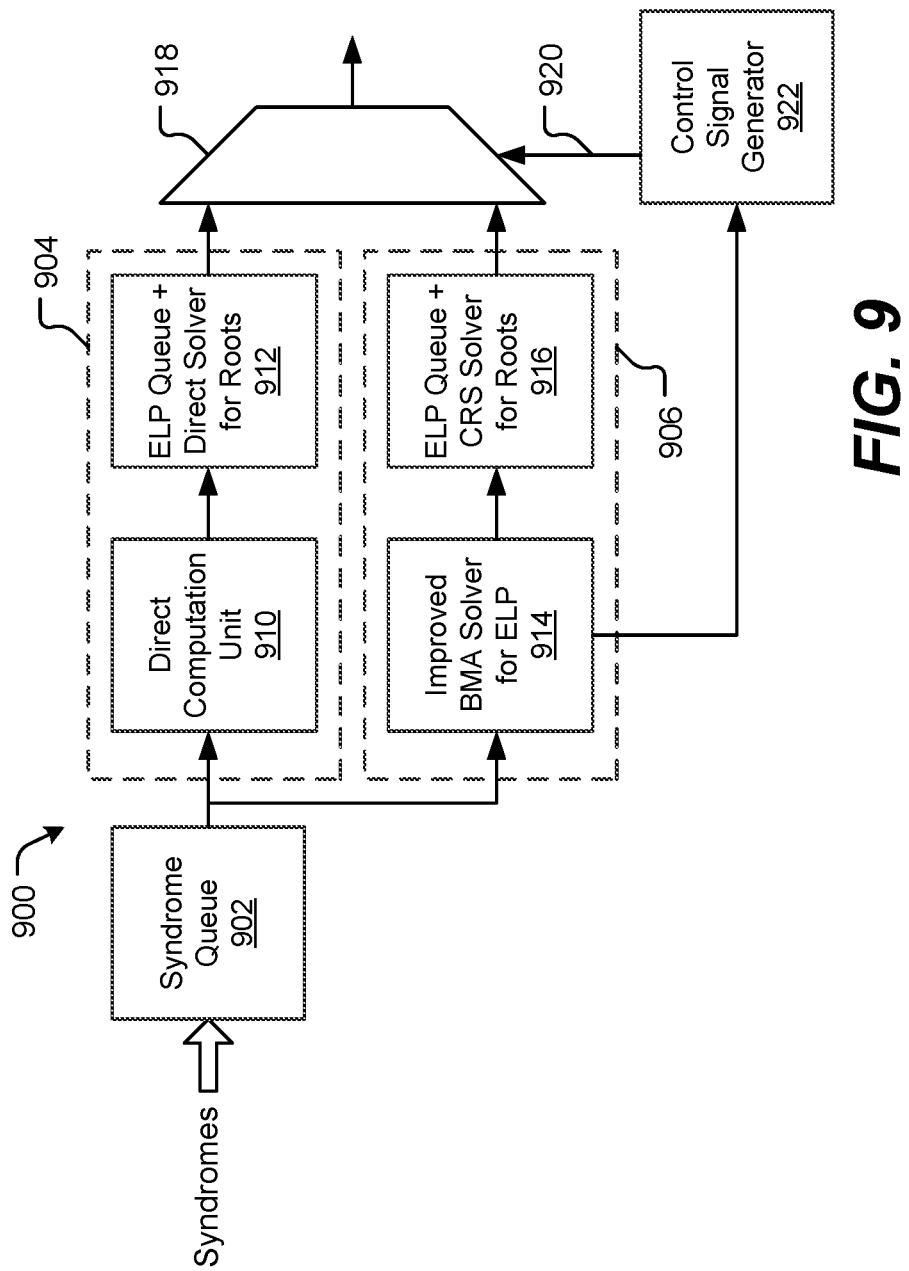
FIG. 9 is a block diagram of a particular example of a decoder having multiple processing paths.
Figure 10:
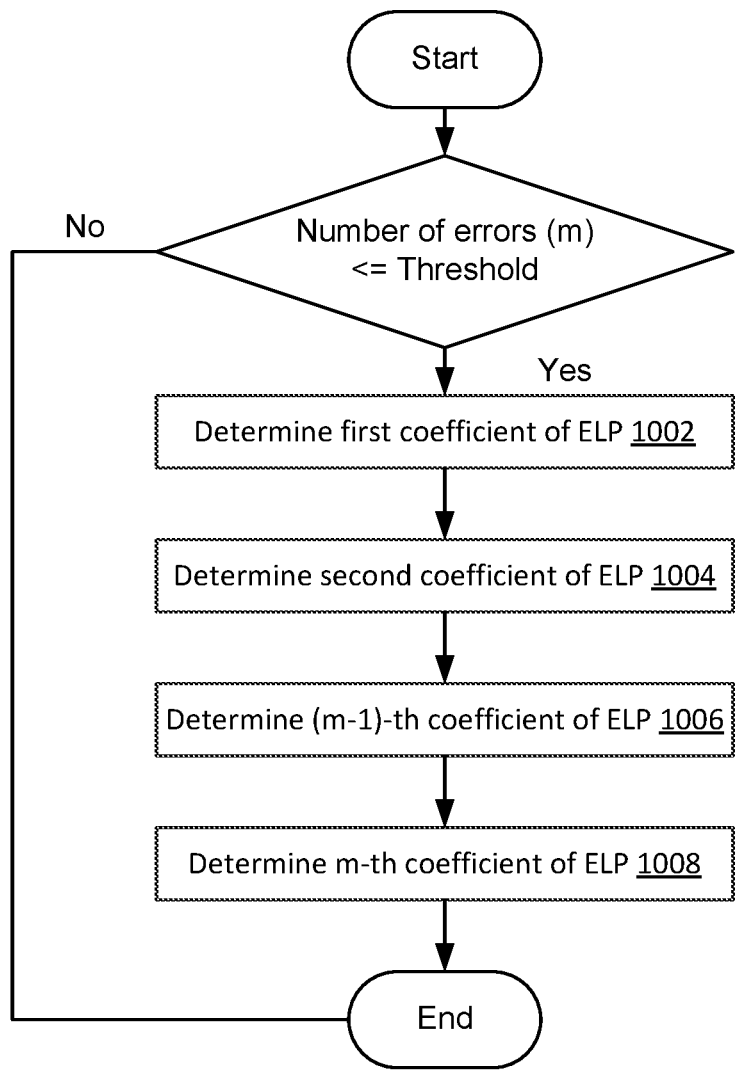
FIG. 10 is a flow chart of a particular example of a method of determining coefficients of an error locator polynomial.

FIG. 9 is a block diagram of an error correction code (ECC) circuitry 900 in accordance with another implementation of the disclosure. In one example, ECC circuitry 900 can be used in one or more of the decoders of FIG. 1, FIG. 2, FIG. 3, or FIG. 8. The ECC circuitry 900 includes a syndrome queue 902 for storing syndromes, a "fast" data path 904, a "slow" data path 906, a control signal generator circuit 922, and a selector circuit 918. The fast data path 904 and the slow path 906 work in parallel, and "race" against each other, wherein the fast path is expected to converge faster when the total errors m of the codeword is less than a preselected threshold TE (e.g., number of errors less than 4). In some implementations, the preselected threshold TE may have a value of 6 or less. In one particular implementation, the threshold TE may have a value of 4. The slow data path 906 results are used when the total errors m is greater than, the preselected threshold TE (e.g., number of errors greater than 4), and in this case the fast path will not converge.

The fast data path 904 may also be referred to as a direct solver circuit 904 that is coupled to a first input of the selector circuit 918 and configured to determine at least one error location. In the illustrated example, the fast data path 904 may include a direct computation unit 910 for computing the error locator polynomial (ELP) coefficients, and an ELP queue plus direct solver for ELP roots 912 (direct root solver). The direct computation unit 910 is configured to determine the coefficients of the ELP corresponding to the syndromes. The direct root solver 912 is configured to determine the roots of the ELP to thereby determine the error locations, which may be stored in an error locator queue.

The fast path 904 performs a "speculative" computation, meaning that the fast path computes TE different sets of ELP coefficients, and corresponding TE sets of speculative error locations. The fast path is set to converge (or commit) on a specific solution, only after the slow path 906 computes the degree L of the ELP. At this point, if L≤TE, the fast path will commit on the solution from the set of speculative solutions which corresponds to L. On the other hand, if L>TE the fast path 904 will not commit on a solution, and the decoding will continue until the slow path 906 converges to a solution. The slow path 906 includes an error locator polynomial generator circuit configured to adjust an error locator polynomial based on an error parity, such as an Improved Berlekamp-Massey algorithm (BMA) solver 914, for determining the coefficients of the ELP from the syndromes stored at the syndrome queue 902. The Improved BMA solver 914 may correspond to the modified BM decoder described with reference to FIGS. 1-7. The slow path 906 also includes a root solver circuit coupled to an output of the error locator polynomial generator circuit, such as an ELP queue plus Chien Root Search (CRS) solver 916 (CRS root solver) for determining the roots of the ELP to thereby determine the error locations, which may be stored in an error location queue.

The syndrome queue 902 may be any suitable type of memory that may be used to store data such as the syndromes determined by the syndrome checkers, such as the syndrome generator circuit 204 in FIG. 2. For example, the syndrome queue 902 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or any suitable data storage device.

In one implementation, the fast data path 904 may be operated as described below. A number of syndromes ($S_i$) for a received codeword are stored in the syndrome queue 902. Based on these syndromes, the direct computation unit 910 can perform a speculative direct computation of several candidate sets for the coefficients of the corresponding error location polynomial (ELP), which are provided to the direct root solver 912. The direct root solver 912 may have a queue or buffer for receiving the ELP coefficients determined by the direct computation unit 910, and is configured to determine the roots of the ELP, for each of the candidate sets of coefficients of the ELP.

The syndromes may be represented in terms of the ELP as follows:

$$S_i = e(\alpha^i) = \sum_{l=1}^{m} (\alpha^{j_l})^i = \sum_{l=1}^{m} \Lambda_l^i,$$

i=1, 2, . . . 2t
Error location polynomial:

$$\Lambda(x) = \Lambda_0 + \sum_{l=1}^{m} \Lambda_l x^l,$$

where $\Lambda_0 = 1$

In one implementation, referring to FIG. 10, the direct computation unit 910 is utilized to compute 4 different sets of coefficients ($\Lambda_1, \Lambda_2, \ldots, \Lambda_{m-1}$, and $\Lambda_m$) of the ELP at blocks 1002 and 1004 through blocks 1006 and 1008.

If m=1 (first order ELP polynomial), the candidate set of coefficients of the ELP may be determined as follows:

$$\Lambda_1 = S_1$$

If m=2 (second order ELP polynomial), the candidate set of coefficients of the ELP may be determined as follows:

$$\Lambda_1 = S_1$$

$$\Lambda_2 = \frac{S_3 + S_1^3}{S_1}$$

If m=3 (third order ELP polynomial), the candidate set of coefficients of the ELP may be determined as follows:

$$\Lambda_1 = S_1$$

$$\Lambda_2 = \frac{S_1^2 S_3 + S_5^3}{S_1^3 + S_3}$$

$$\Lambda_3 = (S_1^3 + S_3) + S_1 \Lambda_2$$

If m=4 (fourth order ELP polynomial), the candidate set of coefficients of the ELP may be determined as follows:

$$\Lambda_1 = S_1$$

$$\Lambda_2 = \frac{S_1(S_7 + S_1^7) + S_3(S_1^5 + S_5)}{S_3(S_1^3 + S_3) + S_1(S_1^5 + S_5)}$$

$$\Lambda_3 = (S_1^3 + S_3) + S_1 \Lambda_2$$

$$\Lambda_4 = \frac{(S_1^2 S_3 + S_5) + (S_1^3 + S_3)\Lambda_2}{S_1}$$

After the direct computation unit 910 computes all the candidate sets of coefficients of the ELP, they are stored at the direct root solver 912, which may have a queue or any suitable data storage for storing the coefficients. The direct root solver 912 is configured to solve for the roots of the ELP for each of the candidate set of coefficients. The direct root solver 912 may use any known methods to solve for the roots of the ELP. For small polynomial degrees, (e.g. 4) solving for the roots may be done by direct computations, i.e. by assigning specific values in predefined functions. Once the slow path 906 will compute the ELP degree, the fast path 904 may commit on the specific set of roots corresponding to the degree L computed by the BMA solver 914 (provided L≤4). The root(s) indicate the locations of the error bits in the received codeword. The error locations may be stored in the error location queue and may be provided to a code word queue that may correct the error bits in the received codeword based on the error locations. An error bit may be corrected by inverting or flipping the bit. An error location queue may be any suitable type of memory that may be used to store data. For example, an error location queue may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like.

Figure 11:
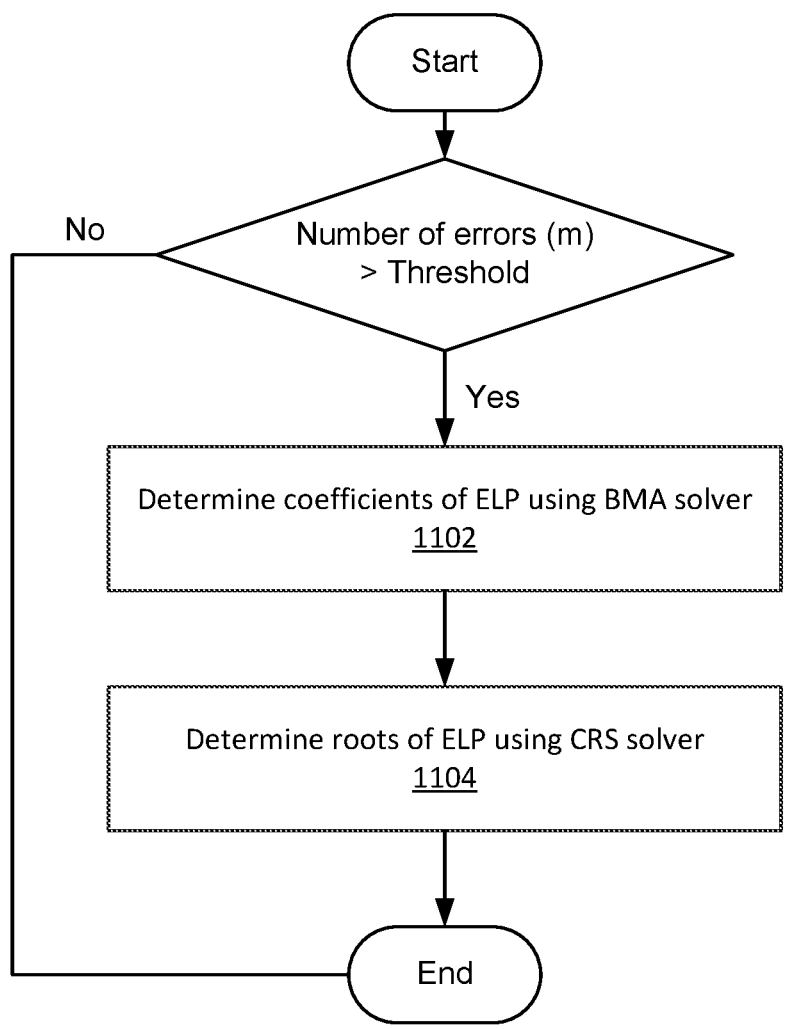
FIG. 11 is a flow chart of a particular example of a method of locating errors at a decoder.

Referring to FIG. 11, if the number of errors of the ELP is greater than the threshold TE (e.g., T=6), the coefficients of the ELP may be determined by using the Improved BMA solver 914 at block 1102. After the Improved BMA solver 914 determines the coefficients of the ELP, they are stored at the CRS root solver 916, which may have a queue or any suitable data storage for storing the coefficients. Then, the CRS root solver 916 may use a Chien search algorithm to determine the roots of the ELP at block 1104. Any known Chien search algorithms or methods may be used. The error locations may be stored in an error location queue and may be provided to a code word queue for correcting the codeword.

Returning to FIG. 9, the control signal generator 922 may be responsive to an output of the error locator generator circuit, illustrated as the Improved BMA solver 914. The control signal generator 922 may be configured to determine, based on the output from the Improved BMA solver 914, whether the error locator polynomial generation converged at a value corresponding to a number of errors less than or equal to the threshold TE. In response to the Improved BMA solver 914 indicating a number of errors less than or equal to the threshold TE, the control signal generator 922 may provide a control signal 920 to a control input of the selector circuit 918 that causes the selector circuit 918 to select an output of the fast path 904, and operation of the root solver 916 may be disabled or skipped. Otherwise, when the number of errors exceeds the threshold TE, the root solver 916 may operate to find error locations based on the error locator polynomial generated by the Improved BMA solver 914, and the control signal generator 922 may provide a control signal 920 that causes the selector circuit 918 to select the output of the root solver 916.

Although the fast path 904 generates error locations for a number of errors less than or equal to the threshold TE, the actual number of errors to be corrected is not determined until the error locator polynomial has been generated by the Improved BMA solver 914. The Improved BMA solver 914 may generate the error locator polynomial in fewer iterations (e.g., half as many iterations) as compared to the BM technique of Table 1, as described with reference to FIGS. 1-7, such as by updating the error locator polynomial based on the error parity. Thus, the ECC circuitry 900 may determine error locations in a reduced number of clock cycles as compared to a decoder using the BM technique of Table 1 due to a reduced number of clock cycles used by the Improved BMA solver 914. In addition, delays associated with operation of the root solver 916 may also be avoided when a number of errors in the decoded data is less than the threshold TE and an output of the fast path 904 can be selected.

Various modifications to the ECC circuitry 900 are possible. For example, in one implementation, the direct computation unit 910 and the Improved BMA solver 914 may be combined into a single solver device. In other implementations, some or all of the direct computation unit 910, the direct root solver 912, the Improved BMA solver 914, and the CRS root solver 916 may be included in the same device. In one implementation, the preselected error threshold (TE) may be four rather than six. In other implementations, the preselected error threshold (TE) can have other suitable values. The direct computation unit 910, the direct root solver 912, the Improved BMA solver 914, and CRS root solver 916 can each be implemented using any corresponding and suitable components as are known in the art.

In effect, the fast path 904 can provide quicker location of the errors in the codeword than the slow path 906. Each of the paths is configured to quickly and efficiently locate the errors based on the expected total number of errors in the syndrome, which may be later confirmed by convergence of the error locator polynomial. This two-path approach can provide quicker and more efficient error location than conventional single path approaches.

Decoding latency of the ECC circuitry 900 of FIG. 9 may be further reduced by applying a fast convergence technique, such as described with reference to FIG. 8. An example of implementing the convergence detector circuit 812 with the dual-path architecture of FIG. 9 is illustrated in FIG. 12.

Figure 12:
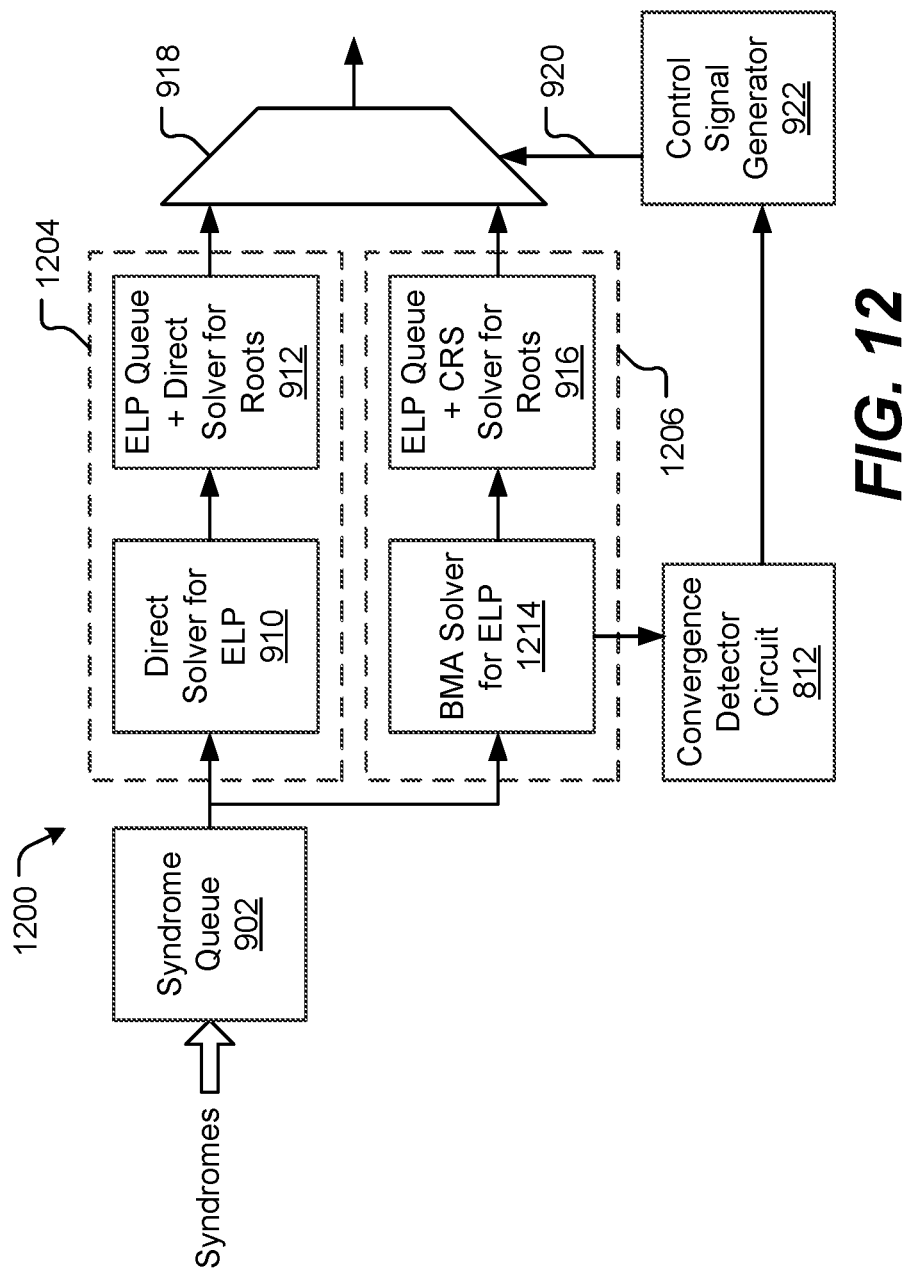
FIG. 12 is a block diagram of another example of a decoder having multiple processing paths.

FIG. 12 depicts an illustrative example of ECC circuitry 1200 that includes the syndrome queue 902, a "fast" path 1204 that may include the direct ELP solver 910 and the direct root solver 912, and a "slow" path 1206 that may include an error locator polynomial generator circuit 1214 and the root solver 916. Outputs of the fast path 1204 and the slow path 1206 are coupled to inputs of the selector circuit 918 and are selected responsive to the control signal 920 from the control signal generator 922.

The convergence detector circuit 812 of FIG. 8 is coupled to the error locator polynomial generator circuit 1214 and may be configured to receive an ELP 824 generated by the error locator polynomial generator circuit 1214 each clock cycle and to determine, in a single clock cycle, whether the ELP 824 has a converged value or will change in a later iteration of the error locator polynomial generator circuit 1214, as described with reference to FIG. 8. Although the convergence detector circuit 812 is described in a fully parallel configuration for single clock cycle convergence detection (e.g., N=t), in other implementations the convergence detector circuit 812 may include fewer computation circuits and may be configured to detect convergence in an average number of clock cycles that is greater than one (e.g., N<t).

The convergence detector circuit 812 is configured to output a convergence signal to the control signal generator 922 upon detection of convergence of an error locator polynomial, enabling faster selection of an output of the fast path 1204 as compared to FIG. 9. For example, in an implementation where the error locator polynomial generator 914 uses the BM technique of Table 1 and the data to be solved includes four errors, the convergence detector circuit 812 may determine that the ELP generated during the fourth iteration of the error location polynomial generator 914 has a converged value, and may signal to the control signal generator circuit 922 (e.g., during the fourth iteration or the fifth iteration) that the data includes four errors. The control signal generator circuit 922 may signal to the selector circuit 918 (e.g., during the fourth iteration or the fifth iteration) to select the output of the fast path 1204 that corresponds to a 4-error solution. Thus, an output of the fast path 1204 may be selected without waiting for the error locator polynomial generator 1204 to complete t iterations in order to verify convergence of the ELP.

Additional latency reduction may be achieved in implementations where the error locator polynomial generator 1204 implements an Improved BM technique as described with reference to FIGS. 1-7, such as including error locator polynomial adjustment based on error parity of received data. For example, the error locator polynomial generator 1214 may correspond to the error locator polynomial generator circuit 208 of FIG. 2. In an example where the data includes four errors, the error locator polynomial generator 1204 may generate the converged value of the ELP in 2 clock cycles or 3 clock cycles, as compared to 4 clock cycles in an implementation where the BM technique of Table 1 is used. Thus, in some cases, the ECC circuitry 1200 may select a 1-error or 2-error solution from the fast path 1204 during a first clock cycle or may select a 3-error or 4-error solution from the fast path 1204 during a second clock cycle (e.g., due to the combination of the combined BM iterations of FIG. 4 and the fast convergence detection of FIG. 8), and may otherwise select an output of the slow path 1206 during a same clock cycle that a converged value of the ELP is generated at the error locator polynomial generator 1204 (e.g., during the fifth clock cycle when the data includes 10 errors).

Figure 13:
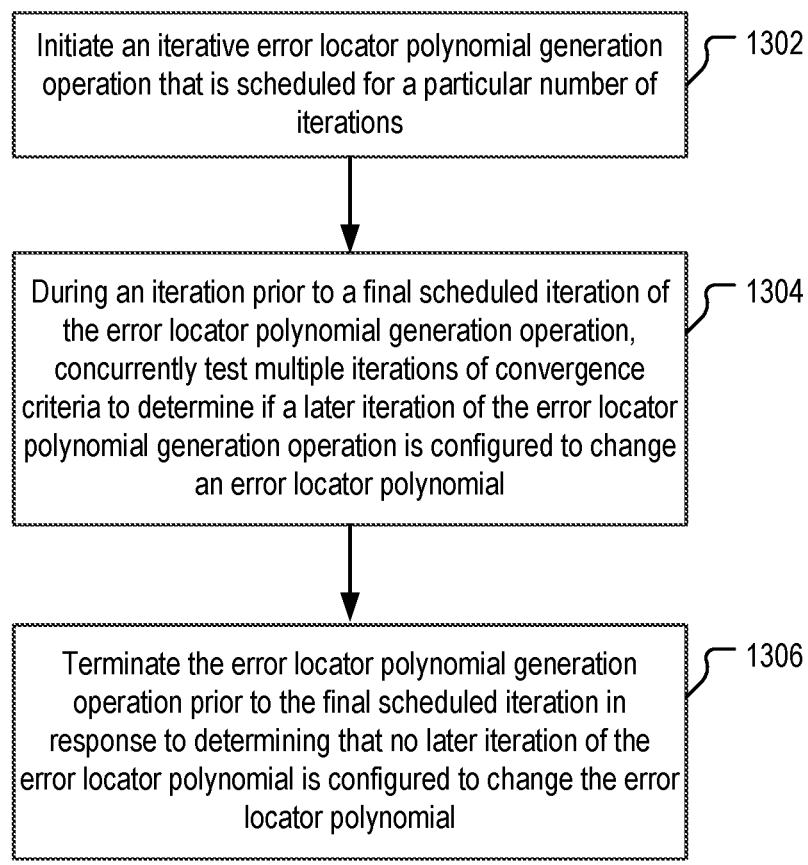
FIG. 13 is a flow chart of a particular example of a method of detecting an error locator polynomial convergence.

FIG. 13 depicts an example of a method that may be performed by a decoder, such as the decoder 802 of FIG. 8 or the ECC circuitry 1200 of FIG. 12. The method includes initiating an iterative error locator polynomial generation operation that is scheduled for a particular number of iterations, at 1302.

During an iteration prior to a final scheduled iteration of the error locator polynomial generation operation, multiple iterations of convergence criteria are concurrently tested to determine if a later iteration of the error locator polynomial generation operation is configured to change an error locator polynomial, at 1304. The convergence criteria may correspond to computations based on syndrome values and coefficients of the error locator polynomial, such as computations of d as described with reference to FIG. 8. To illustrate, the convergence criteria may be calculated as the convergence criteria of Example 2 or Example 3.

For example, the multiple iterations of convergence criteria may correspond to all remaining iterations of the error locator polynomial generation operation and may be tested in parallel during a single clock cycle, such as in a fully-parallel implementation of the decoder 802 of FIG. 8 where N equals t. As another example, the multiple iterations of convergence criteria may correspond to fewer than all of the remaining iterations of the error locator polynomial generation operation, such as in a partial-parallel implementation of the decoder 802 of FIG. 8 where N is greater than two but less than t.

The error locator polynomial generation operation is terminated prior to the final scheduled iteration in response to determining that no later iteration of the error locator polynomial is configured to change the error locator polynomial, at 1306.

By terminating the error locator polynomial generation operation upon detection of convergence of the error locator polynomial (e.g., upon detecting that the error locator polynomial will not change in any future iteration), decoding latency may be reduced.

Figure 14:
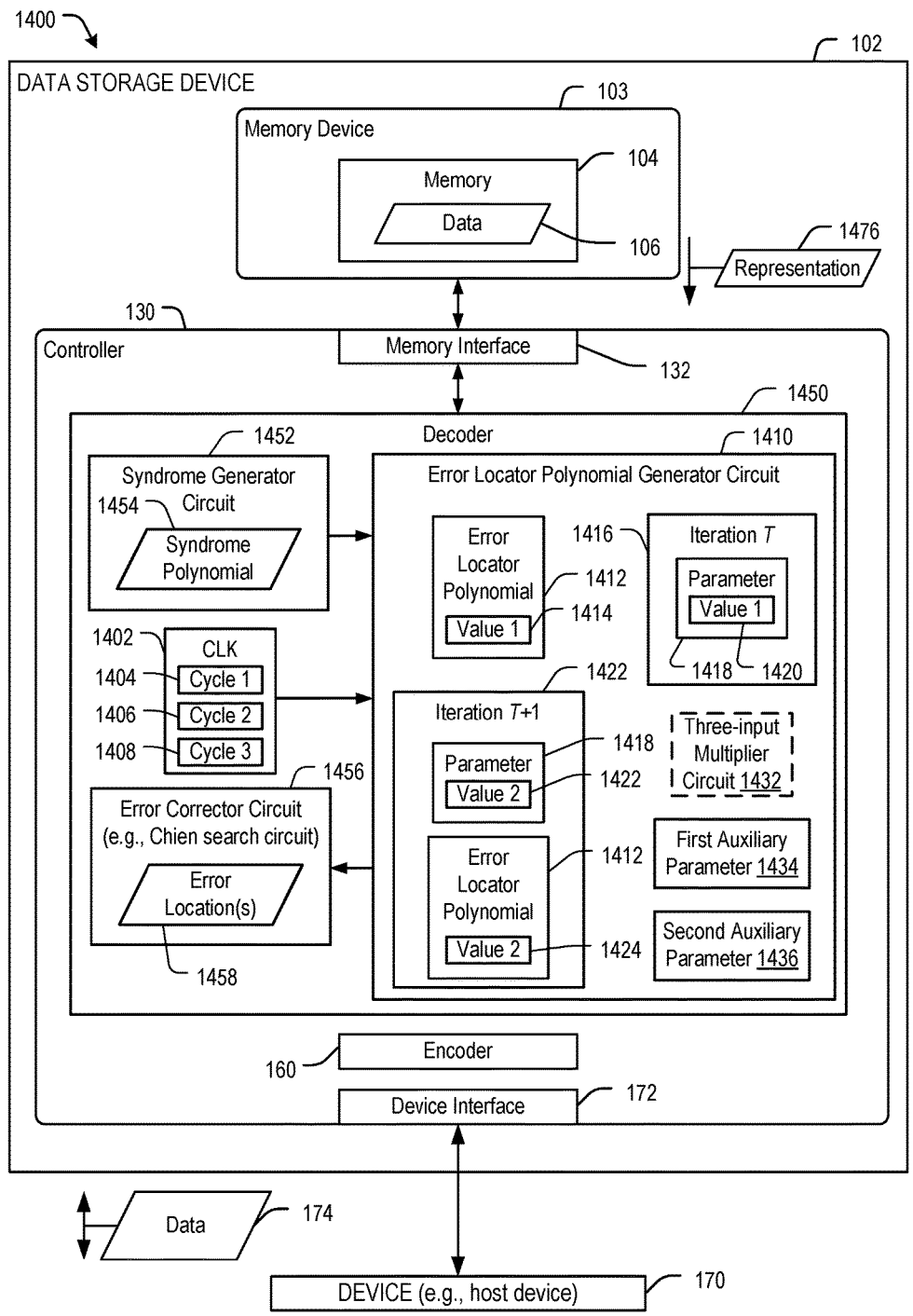
FIG. 14 is a block diagram of a particular illustrative example of a system including a data storage device that includes a decoder configured to determine an error locator polynomial with reduced latency.

Referring to FIG. 14, a particular implementation of a system 1400 is illustrated that includes a data storage device 1402 (e.g., the data storage device 102) coupled to the device 170. The data storage device 1402 includes the memory device 103 coupled to the controller 130.

The controller 130 includes an error correction device, such as a decoder 1450 that is coupled to the memory interface 132. The decoder 1450 is configured to perform a decode operation to decode data retrieved from the memory device 103, such as by performing a decode operation to decode a representation 1476 of one or more codewords included in the data 106. To illustrate, the decoder 1450 may include a BCH decoder that has a syndrome generator circuit 1452 (e.g., the syndrome generator circuit 204 or the syndrome generator 806), an error locator polynomial generator circuit 1410, and an error corrector circuit 1456 (e.g., the error corrector circuit 210 or the root solver 810). The syndrome generator circuit 1452 may be coupled to an input of the error locator polynomial generator circuit 1410, and the error corrector circuit 1456 may be coupled to the output of the error locator polynomial generator circuit 1410.

One or more components of the decoder 1450 may be responsive to a clock signal 1402. For example, the error locator polynomial generator circuit 1410 may be responsive to the clock signal 1402. In the example of FIG. 14, the clock signal 1402 includes a first cycle 1404, a second cycle 1406 that sequentially follows the first cycle 1404, and a third cycle 1408 that sequentially follows the second cycle 1406.

During operation, the syndrome generator circuit 1452 may process data read from the memory device 103 and generate a set of syndromes corresponding to the received data. For example, the memory interface 132 is configured to receive a representation 1476 of one or more codewords included in the data 106, and the syndrome generator circuit 1452 may be configured to generate a syndrome polynomial 1454 corresponding to the representation 1476. The syndrome polynomial 1454 may be provided to the error locator polynomial generator circuit 1410.

The error locator polynomial generator circuit 1410 may be configured to perform an iterative process to generate an error locator polynomial based on the syndrome polynomial 1454. For example, the error locator polynomial generator circuit 1410 may be configured to generate the error locator polynomial according to a Berlekamp-Massey (BM) technique, such as described with reference to Table 1. As used herein, a BM technique may refer to a decoding technique that identifies indications of one or more errors of a representation of a codeword using a linear feedback shift register (LFSR) technique to identify a "minimal" degree of an error locator polynomial C(x) that results in all syndromes of the representation corresponding to zero. Alternatively or in addition to a BM technique, the error locator polynomial generator circuit 808 may perform another technique.

In connection with a decode operation that uses a BM technique, the error locator polynomial generator circuit 1410 may be configured to set a particular value of an error locator polynomial 1412 (also referred to herein as C(D) at iteration T, or as $C^T$) and to iteratively update the particular value of the error locator polynomial 1412 during subsequent iterations of the BM technique (e.g., to determine $C^{T+1}$ and/or $C^{T+2}$). For example, the error locator polynomial generator circuit 1410 may be configured to set the error locator polynomial 1412 to a scalar 1 value and may update the value during subsequent iterations of the BM technique. Depending on the particular iteration, the value of the error locator polynomial 1412 may be updated while changing the degree of C(D), the value of the error locator polynomial 1412 may be updated without changing the degree of C(D), or C(D) may be unchanged.

In an illustrative example, the error locator polynomial generator circuit 1410 is configured to perform certain operations that "condense" operations of a conventional BM technique in order to reduce latency, such as by "condensing" operations performed to determine $C^{T+2}$ from four cycles of the clock signal 1402 to two cycles or three cycles of the clock signal 1402. For example, certain BM techniques use two clock cycles to determine parameter values associated with a particular iteration of a BM decoding process. In FIG. 14, the error locator polynomial generator circuit 1410 may be configured to determine one or more parameters associated with a particular iteration of a decoding process while concurrently determining one or more parameters associated with another iteration of the decoding process.

To further illustrate, Table 2 depicts certain parameters that may be used during decoding based on a BM technique. In Table 2, each parameter is associated with (e.g., is generated during) a particular iteration T of a BM-based technique (where T=0, . . . , t, and where t indicates the correction capability of the particular error correcting code). In Table 2 and FIGS. 14-18, certain indices are notated using superscripts instead of subscripts as used in other portions of the description. Further, in connection with Table 2 and FIGS. 14-18, an input to iteration T may be indicated by a superscript "T," and an output from iteration T may be indicated by a superscript "T+1." (In connection with FIGS. 1-13, an output of iteration T may be indicated by a subscript "T"). Thus, "$d_T$" in Example 2, "$d_T$" in Example 3, and "$d^{(T+1)}$" in Table 2 may refer to the same parameter.

TABLE 2

| Parameter(s) | Description or Definition of Parameter(s) |
| --- | --- |
| $C^{(T)}(D)$ | Value of error locator polynomial input to iteration T |
| $L^{(T)}$ | $\deg(C^{(T)}(D))$ |
| $d^{(T+1)}$ | A parameter computed at iteration T (e.g., as a convolution of $C^{(T)}(D)$ and the syndrome polynomial) If $d^{(T+1)} == 0$, then $C^{(T+1)}(D) = C^{(T)}(D)$ If $d^{(T+1)} \neq 0$, then $C^{(T+1)}(D) \neq C^{(T)}(D)$, and the value of $d^{(T+1)}$ may be used to modify $C^{(T)}(D)$ to compute $C^{(T+1)}(D)$ |
| $B^{(T)}(D)$ | An auxiliary polynomial having a value $C^{(k)}(D)$ for some k < T |
| $b^{(T)}$ | An auxiliary field scalar having a value $d^{(k)}$ for some k < T |

TABLE 2-continued

| Parameter(s) | Description or Definition of Parameter(s) |
|---|---|
| x(T) | A scalar indicating a shift to be applied to $B^{(T)}(D)$ and having a value (for each iteration) either incremented by 2 or reset to the value 2 |

Certain conventional BM decoding techniques may use a first clock cycle to determine a value during iteration T as follows:

$$d^{(T+1)} = \sum_{i=0}^{L} c_i S_{2T+1-i}$$

One or more other parameters related to iteration T may be determined in a second clock cycle. For example, one or more parameters dependent on the value of $d^{(T+1)}$ may be "deferred" to the second clock cycle. As an example, $C^{(T+1)}(D)$ may be determined using multiplication by $d^{(T+1)}$ and may be "deferred" to the second clock cycle. To further illustrate, a conventional BM decoding technique may determine certain parameters in the second clock cycle as follows:

$$b^{(T+1)} = \begin{cases} b^{(T)} & d^{(T+1)} = 0 \text{ OR } L^{(T)} > T \\ d^{(T+1)} & d^{(T+1)} \neq 0 \text{ AND } L^{(T)} \leq T \end{cases}$$

$$C^{(T+1)}(D) = \begin{cases} b^{(T)} C^{(T)}(D) + d^{(T+1)} D^x B^{(T)}(D) & d^{(T+1)} \neq 0 \\ C^{(T)}(D) & d^{(T+1)} = 0 \end{cases}$$

$$B^{(T+1)}(D) = \begin{cases} C^{(T)}(D) & d^{(T+1)} \neq 0 \text{ AND } L^{(T)} \leq T \\ B^{(T)}(D) & d^{(T+1)} = 0 \text{ OR } L^{(T)} > T \end{cases}$$

$$L^{(T+1)} = \begin{cases} L^{(T)} & d^{(T+1)} = 0 \text{ OR } L^{(T)} > T \\ 2T + 1 - L^{(T)} & d^{(T+1)} \neq 0 \text{ AND } L^{(T)} \leq T \end{cases}$$

$$x(T+1) = \begin{cases} x(T) + 2 & d^{(T+1)} = 0 \text{ OR } L^{(T)} > T \\ 2 & d^{(T+1)} \neq 0 \text{ AND } L^{(T)} \leq T \end{cases}$$

In a first example in accordance with FIG. 14, $d^{(T+2)}$ may be computed during the second clock cycle of iteration T using one or more auxiliary computations performed on the first clock cycle of iteration T. Thus, values associated with iterations T and T+1 may be computed in three clock cycles (instead of four). In the first example, input parameter values associated with iteration T may include $B^{(T)}(D)$, $C^{(T)}(D)$, $d^{(T)}$, $b^{(T)}$, $L^{(T)}$, and x(T), and output parameter values associated with iteration T may include $B^{(T+1)}(D)$, $C^{(T+1)}(D)$, $d^{(T+1)}$, $b^{(T+1)}$, $L^{(T+1)}$, and x(T+1). At the end of iteration T, an iteration index may be set to T+1.

To further illustrate aspects of the first example, during the first cycle 1404, the error locator polynomial generator circuit 1410 may determine values associated with a first iteration 1416 (e.g., iteration T). For example, during the first cycle 1404, the error locator polynomial generator circuit 1410 may determine a first value 1420 (e.g., $d^{(T+1)}$) of a parameter 1418 (e.g., d), a first auxiliary parameter 1434 (e.g., $e_1$), and a second auxiliary parameter 1436 (e.g., $e_2$). To illustrate, the first value 1420 of the parameter 1418 and the auxiliary parameters 1434, 1436 may be determined as follows:

$$d^{(T+1)} = \sum_{i=0}^{L} c_i S_{2T+1-i}$$

$$e_1 = \sum_{i=0}^{L} c_i S_{2T+3-i}$$

$$e_2 = \sum_{i=0}^{L+1-x} b_i S_{2T+3-x-i}$$

The first value 1420 of the parameter 1418 is based on a value of the error locator polynomial 1412 associated with a prior iteration of the decode operation. For example, $C^T$ may be determined during an iteration of the decode operation that occurs prior to the iteration T (e.g., during iteration T=0), and the first value 1420 may be based on $C^T$.

Computation of the auxiliary parameters 1434, 1436 may be of similar complexity to computational complexity of $d^{(T+1)}$ and may be performed in parallel with computation of $d^{(T+1)}$. The auxiliary parameters 1434, 1436 may correspond to the parameters $e_1$ and $e_2$ described with reference to Examples 1 and 3 and FIG. 4.

During the second cycle 1406, the error locator polynomial generator circuit 1410 may determine one or more other values associated with the first iteration 1416 and one or more values associated with a second iteration 1422 (e.g., iteration T+1). For example, the error locator polynomial generator circuit 1410 may determine a second value 1422 (e.g., $d^{(T+2)}$) of the parameter 1418 based on the first value 1420 of the parameter 1418, the first auxiliary parameter 1434, and the second auxiliary parameter 1436. The second value 1422 of the parameter 1418 is associated with (e.g., is generated during) the second iteration 1422. During the second cycle 1406, the error locator polynomial generator circuit 1410 may also determine one or more parameters related to the first iteration 1416, such as a value (e.g., $C^{(T+1)}(D)$) of the error locator polynomial 1412. The error locator polynomial generator circuit 1410 may also determine one or more other parameters related to the first iteration 1416, such as $b^{(T+1)}$, $B^{(T+1)}(D)$, $L^{(T+1)}$, and $x^{(T+1)}$.

To further illustrate, during the second cycle 1406, $d^{(T+2)}$, $b^{(T+1)}$, $c^{(T+1)}(D)$, $B^{(T+1)}(D)$, $L^{(T+1)}$, and x(T+1) may be determined as follows:

$$d^{(T+2)} = \begin{cases} e_1 & d^{(T+1)} = 0 \\ b^{(T)} e_1 + d^{(T+1)} e_2 & d^{(T+1)} \neq 0 \end{cases}$$

$$b^{(T+1)} = \begin{cases} b^{(T)} & d^{(T+1)} = 0 \text{ OR } L^{(T)} > T \\ d^{(T+1)} & d^{(T+1)} \neq 0 \text{ AND } L^{(T)} \leq T \end{cases}$$

$$C^{(T+1)}(D) = \begin{cases} b^{(T)} C^{(T)}(D) + d^{(T+1)} D^x B^{(T)}(D) & d^{(T+1)} \neq 0 \\ C^{(T)}(D) & d^{(T+1)} = 0 \end{cases}$$

$$B^{(T+1)}(D) = \begin{cases} C^{(T)}(D) & d^{(T+1)} \neq 0 \text{ AND } L^{(T)} \leq T \\ B^{(T)}(D) & d^{(T+1)} = 0 \text{ OR } L^{(T)} > T \end{cases}$$

$$L^{(T+1)} = \begin{cases} L^{(T)} & d^{(T+1)} = 0 \text{ OR } L^{(T)} > T \\ 2T + 1 - L^{(T)} & d^{(T+1)} \neq 0 \text{ AND } L^{(T)} \leq T \end{cases}$$

$$x(T+1) = \begin{cases} x(T) + 2 & d^{(T+1)} = 0 \text{ OR } L^{(T)} > T \\ 2 & d^{(T+1)} \neq 0 \text{ AND } L^{(T)} \leq T \end{cases}$$

During the third cycle 1408, the error locator polynomial generator circuit 1410 may determine one or more other values associated with the second iteration 1422. For example, the error locator polynomial generator circuit 1410 may determine an adjusted value 1424 (e.g., $C^{(T+2)}(D)$) of the error locator polynomial 1412. The error locator polynomial generator circuit 1410 may also determine $b^{(T+2)}$, $B^{(T+2)}$, $L^{(T+2)}$, and x(T+2).

To further illustrate, during the third cycle 1408, $C^{(T+2)}$, $B^{(T+2)}(D)$, $L^{(T+2)}$, and x(T+2) may be determined as follows:

$$b^{(T+2)} = \begin{cases} b^{(T+1)} & d^{(T+2)} = 0 \text{ OR } L^{(T+1)} > T+1 \\ d^{(T+2)} & d^{(T+2)} \neq 0 \text{ AND } L^{(T+1)} \leq T+1 \end{cases}$$

$$C^{(T+2)}(D) = \begin{cases} b^{(T+1)}C^{(T+1)}(D) + d^{(T+2)}D^x B^{(T+1)}(D) & d^{(T+2)} \neq 0 \\ C^{(T+1)}(D) & d^{(T+2)} = 0 \end{cases} \quad 5$$

$$B^{(T+2)}(D) = \begin{cases} C^{(T+1)}(D) & d^{(T+2)} \neq 0 \text{ AND } L^{(T+1)} \leq T+1 \\ B^{(T+1)}(D) & d^{(T+2)} = 0 \text{ OR } L^{(T+1)} > T+1 \end{cases}$$

$$L^{(T+2)} = \begin{cases} L^{(T+1)} & d^{(T+2)} = 0 \text{ OR } L^{(T+1)} > T+1 \\ 2T+3-L^{(T+1)} & d^{(T+2)} \neq 0 \text{ AND } L^{(T+1)} \leq T+1 \end{cases}$$

$$x(T+2) = \begin{cases} x(T+1)+2 & d^{(T+2)} = 0 \text{ OR } L^{(T+1)} > T+1 \\ 2 & d^{(T+2)} \neq 0 \text{ AND } L^{(T+1)} \leq T+1 \end{cases} \quad 15$$

In accordance with the first example, the error locator polynomial generator circuit 1410 may determine values associated with two iterations of a BM technique (e.g., values associated with the iterations 1416, 1422) using three clock cycles (e.g., the cycles 1404, 1406, and 1408) instead of using four cycles. As a result, a device in accordance with aspects of the first example may reduce a number of clock cycles by 25 percent as compared to a device that uses a conventional BM technique. Certain illustrative aspects of the first example are described further with reference to FIG. 15.

In a second example in accordance with FIG. 14, one or more of $d^{(T+2)}$, $b^{(T+2)}$, $C^{(T+2)}(D)$, $B^{(T+2)}(D)$, $L^{(T+2)}$, and $x^{(T+2)}$ may be determined directly from input parameters to iteration T (e.g., directly from $d^{(T)}$, $b^{(T)}$, $C^{(T)}(D)$, $B^{(T)}(D)$, $L^{(T)}$, and $x(T)$). To further illustrate, Table 3 illustrates certain aspects that may be associated with the second example. In Table 3, the leftmost column indicates a condition reference number for convenience of description, the middle column indicates a condition for iteration T and for iteration T+1, and the rightmost column indicates a simplified condition (e.g., a logically equivalent condition).

TABLE 3

| No. | Condition | Simplified Condition |
|---|---|---|
| 1. | $d^{(T+1)} = 0$ AND $d^{(T+2)} = 0$ | $d^{(T+1)} = 0$ AND $e_1 = 0$ |
| 2. | $d^{(T+1)} = 0$; $d^{(T+2)} \neq 0$ AND $L^{(T+1)} > T+1$ | $d^{(T+1)} = 0$ AND $e_1 \neq 0$ AND $L^{(T)} > T+1$ |
| 3. | $d^{(T+1)} = 0$; $d^{(T+2)} \neq 0$ AND $L^{(T+1)} \leq T+1$ | $d^{(T+1)} = 0$ AND $e_1 \neq 0$ AND $L^{(T)} \leq T+1$ |
| 4. | $d^{(T+1)} \neq 0$ AND $L^{(T)} > T$ AND $d^{(T+2)} = 0$ | $d^{(T+1)} \neq 0$ AND $b^{(T)}e_1 + d^{(T+1)}e_2 = 0$ AND $L^{(T)} > T$ |
| 4. | $d^{(T+1)} \neq 0$ AND $L^{(T)} > T$ AND $d^{(T+2)} = 0$ | $d^{(T+1)} \neq 0$ AND $b^{(T)}e_1 + d^{(T+1)}e_2 = 0$ AND $L^{(T)} > T$ |
| 5. | $d^{(T+1)} \neq 0$ AND $L^{(T)} \leq T$ AND $d^{(T+2)} = 0$ | $d^{(T+1)} \neq 0$ AND $b^{(T)}e_1 + d^{(T+1)}e_2 = 0$ AND $L^{(T)} \leq T$ |
| 6. | $d^{(T+1)} \neq 0$ AND $L^{(T)} > T$ AND $d^{(T+2)} \neq 0$ AND $L^{(T+1)} > T+1$ | $d^{(T+1)} \neq 0$ AND $b^{(T)}e_1 + d^{(T+1)}e_2 \neq 0$ AND $L^{(T)} > T+1$ |
| 7. | $d^{(T+1)} \neq 0$ AND $L^{(T)} > T$ AND $d^{(T+2)} \neq 0$ AND $L^{(T+1)} \leq T+1$ | $d^{(T+1)} \neq 0$ AND $b^{(T)}e_1 + d^{(T+1)}e_2 \neq 0$ AND $L^{(T)} = T+1$ |
| 8. | $d^{(T+1)} \neq 0$ AND $L^{(T)} \leq T$ AND $d^{(T+2)} \neq 0$ AND $L^{(T+1)} \leq T+1$ | $d^{(T+1)} \neq 0$ AND $b^{(T)}e_1 + d^{(T+1)}e_2 \neq 0$ AND $L^{(T)} = T$ |
| 9. | $d^{(T+1)} \neq 0$ AND $L^{(T)} \leq T$ AND $d^{(T+2)} \neq 0$ AND $L^{(T+1)} > T+1$ | $d^{(T+1)} \neq 0$ AND $b^{(T)}e_1 + d^{(T+1)}e_2 \neq 0$ AND $L^{(T)} < T$ |

In the second example, $d^{(T+2)}$, $b^{(T+2)}$, $C^{(T+2)}(D)$, $B^{(T+2)}(D)$, $L^{(T+2)}$, and $x(T+2)$ may be determined based on $b^{(T)}$, $C^{(T)}(D)$, $B^{(T)}(D)$, $L^{(T)}$, and $x(T)$ and further based on $d^{(T+1)}$, $e_1$, and $e_2$ according to the following equations. In the following equations, certain superscripts are removed from the right side of the equations for readability. For example, on the right side d may indicate $d^{(T+1)}$, and b, C(D), B(D), L, and x may indicate $b^{(T)}$, $C^{(T)}(D)$, $B^{(T)}(D)$, $L^{(T)}$, and $x(T)$, respectively. The numbers on the right side of the equations indicate corresponding condition reference numbers from the leftmost column of Table 3.

$$d = d^{(T+1)} = \sum_{i=0}^{L} c_i S_{2T+1-i}, \; e_1 = \sum_{i=0}^{L} c_i S_{2T+3-i}, \; e_2 = \sum_{i=0}^{L+1-x} b_i S_{2T+3-i-x}$$

$$d^{(T+2)} = \begin{cases} e_1 & d=0 & 1-3 \\ be_1 + de_2 & d \neq 0 & 4-8 \end{cases}$$

$$b^{(T+2)} = \begin{cases} b & 1, 2, 4, 6 \\ d & 5, 9 \\ e_1 & 3 \\ be_1 + de_2 & 7, 8 \end{cases}$$

$$C^{(T+2)}(D) = \begin{cases} C & 1 \\ bC(D) + dD^x B(D) & 4, 5 \\ bC(D) + e_1 D^{x+2} B(D) & 2, 3 \\ b^2 C(D) + bdD^x B(D) + (be_1 + de_2)D^{x+2} B(D) & 6, 7 \\ bdC(D) + d^2 D^x B(D) + (be_1 + de_2)D^2 C(D) & 8, 9 \end{cases}$$

$$B^{(T+2)}(D) = \begin{cases} B(D) & 1, 2, 4, 6 \\ C(D) & 3, 5, 9 \\ bC(D) + dD^x B(D) & 7, 8 \end{cases}$$

-continued $$L^{(T+2)} = \begin{cases} L & 1, 2, 4, 6 \\ L+2 & 8 \\ 2T+1-L & 5, 9 \\ 2T+3-L & 3, 7 \end{cases}$$

$$x(T+2) = \begin{cases} x+4 & 1,2,4,6 \\ 4 & 5,9 \\ 2 & 3,7,8 \end{cases}$$

In a particular implementation of the second example, determination of d, $e_1$, and $e_2$ is performed in one clock cycle of the clock signal 1402 (e.g., during the first cycle 1404). Other parameters (e.g., $b^{(T+2)}$, $B^{(T+2)}(D)$, $L^{(T+2)}$, and $x(T+2)$) may be determined in another cycle of the clock signal 1402 (e.g., during the second cycle 1406) following determination d, $e_1$, and $e_2$. In some cases, $C^{(T+2)}(D)$ may be determined during the second cycle 1406 in parallel with determination of $b^{(T+2)}$, $B^{(T+2)}(D)$, $L^{(T+2)}$, and $x(T+2)$, and in other cases, $C^{(T+2)}(D)$ may be determined during the third cycle 1408 (after determination of $b^{(T+2)}$, $B^{(T+2)}(D)$, $L^{(T+2)}$, and $x(T+2)$). To illustrate, for conditions 6, 7, 8, or 9, determination of $C^{(T+2)}(D)$ may include multiplication of three input values. In this case, $C^{(T+2)}(D)$ may be determined during the third cycle 1408. Certain illustrative aspects of the second example are described further with reference to FIG. 16.

In a third example, the error locator polynomial generator circuit 1410 includes a three-input multiplier circuit 1432. In the third example, the three-input multiplier circuit 1432 is configured to perform one or more three-input multiplication operations to enable determination of $C^{(T+2)}(D)$ during the second cycle 1406 in parallel with determination of $b^{(T+2)}$, $B^{(T+2)}(D)$, $L^{(T+2)}$, and $x(T+2)$ in case conditions 6, 7, 8, or 9. By determining $C^{(T+2)}(D)$ using two cycles of the clock signal 1402 (e.g., using the cycles 1404, 1406), the error locator polynomial generator circuit 1410 may reduce latency by 50 percent reduction as compared to certain conventional BM techniques that use four cycles to determine updated values of an error locator polynomial for two iterations.

After determining $C^{(T+2)}(D)$ (e.g., using the first example, the second example, or the third example) and continuing decoding until determining that the error locator polynomial has converged, the error locator polynomial generator circuit 1410 may provide the error locator polynomial to the error corrector circuit 1456. For example, $C^{(T+2)}(D)$ may correspond to the adjusted value 1424 of the error locator polynomial 1412 at a final decoding iteration, and the error locator polynomial generator circuit 1410 may provide the adjusted value 1424 of the error locator polynomial 1412 to the error corrector circuit 1456.

The error corrector circuit 1456 may be configured to identify one or more error locations 1458 and to correct one or more errors of the representation 1476 using the adjusted value 1424 of the error locator polynomial 1412. For example, the error corrector circuit 1456 may be configured to determine roots of the adjusted value 1424 of the error locator polynomial 1412 that corresponds to one or more error locations 1458. In an illustrative example, the error corrector circuit 1456 is configured to determine roots of the adjusted value 1424 of the error locator polynomial 1412 using a Chien search technique. As used herein, a Chien search technique may refer to a technique for identifying roots of a polynomial over a finite field by testing values of the polynomial in a particular order that is associated with a generator element of the finite field (e.g., to reduce a number of computations as compared to a "brute force" search for polynomial roots). Alternatively or in addition to a Chien search technique, the error corrector circuit 1456 may be configured to determine roots of the adjusted value 1424 of the error locator polynomial 1412 using another technique.

The examples described with reference to FIG. 14 reduce latency associated with an iterative decoding process. For example, by determining values of one or more parameters associated with iteration T+1 during iteration T, certain operations may be "condensed" at the decoder 1450. As a result, latency associated with decoding of the representation 1476 may be reduced.

Although certain aspects have been described separately for convenience, it should be appreciated that certain aspects may be combined without departing from the scope of the disclosure. For example, one or more aspects described with reference to FIG. 14 may be combined with one or more aspects described with reference to FIGS. 1-13. In an illustrative example, fast convergence detection (e.g., as described with reference to one or more of Example 2, Example 3, or FIGS. 8-13) may be performed by the decoder 1450 of FIG. 14. In an illustrative example, the decoder 1450 includes the convergence detector circuit 812 of FIG. 8. Alternatively, the convergence detector circuit 812 may be omitted from the decoder 1450 of FIG. 14.

Figure 15:
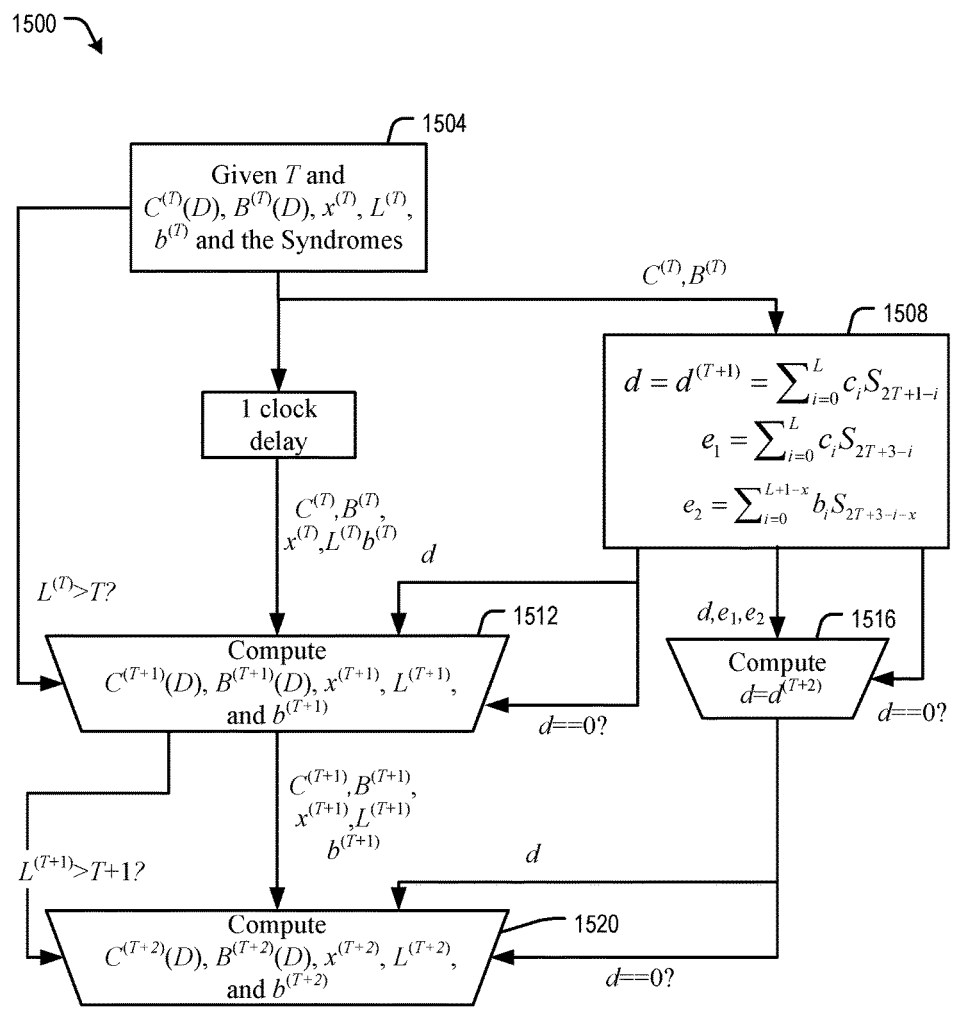
FIG. 15 is a flow chart illustrating operations that may be performed in accordance with a first example of the data storage device of FIG. 14.

FIG. 15 is a flow chart illustrating operations 1500 that may be performed in accordance with the first example of the data storage device 102 described with reference to FIG. 14. The operations 1500 may be performed by the error locator polynomial generator circuit 1410 of FIG. 14.

The operations 1500 include receiving a set of parameters associated with the representation 1476, at 1504. The set of parameters may include $C^{(T)}(D)$, $B^{(T)}(D)$, $x^{(T)}$, $L^{(T)}$, $b^{(T)}$ and syndromes (e.g., the syndrome polynomial 1454). The set of parameters may be received at the error locator polynomial generator circuit 1410.

The operations 1500 further include determining $d^{(T+1)}$ (e.g., the first value 1420 of the parameter 1418), $e_1$ (e.g., the first auxiliary parameter 1434), and $e_2$ (e.g., the second auxiliary parameter 1436), at 1508. The values of $d^{(T+1)}$, $e_1$, and $e_2$ may be determined during the first cycle 1404 of the clock signal 1402, and $C^{(T)}(D)$, $B^{(T)}(D)$, $x^{(T)}$, $L^{(T)}$, $b^{(T)}$ and the syndromes may be determined during a cycle that precedes the first cycle 1404, as an illustrative example.

The operations 1500 further include determining $C^{(T+1)}(D)$, $B^{(T+1)}(D)$, $x^{(T+1)}$, $L^{(T+1)}$, and $b^{(T+1)}$, at 1512, and determining $d^{(T+2)}$, at 1516. In an illustrative example, $C^{(T+1)}(D)$, $B^{(T+1)}(D)$, $x^{(T+1)}$, $L^{(T+1)}$, and $b^{(T+1)}$, and $d^{(T+2)}$ are determined during a common clock cycle, such as during the second cycle 1406 of the clock signal 1402.

The operations 1500 further include determining $C^{(T+2)}(D)$, $B^{(T+2)}(D)$, $x^{(T+2)}$, $L^{(T+2)}$, and $b^{(T+2)}$, at 1520. For example, $C^{(T+2)}(D)$, $B^{(T+2)}(D)$, $x^{(T+2)}$, $L^{(T+2)}$, and $b^{(T+2)}$ may be determined during the third cycle 1408 of the clock signal 1402.

Figure 16:
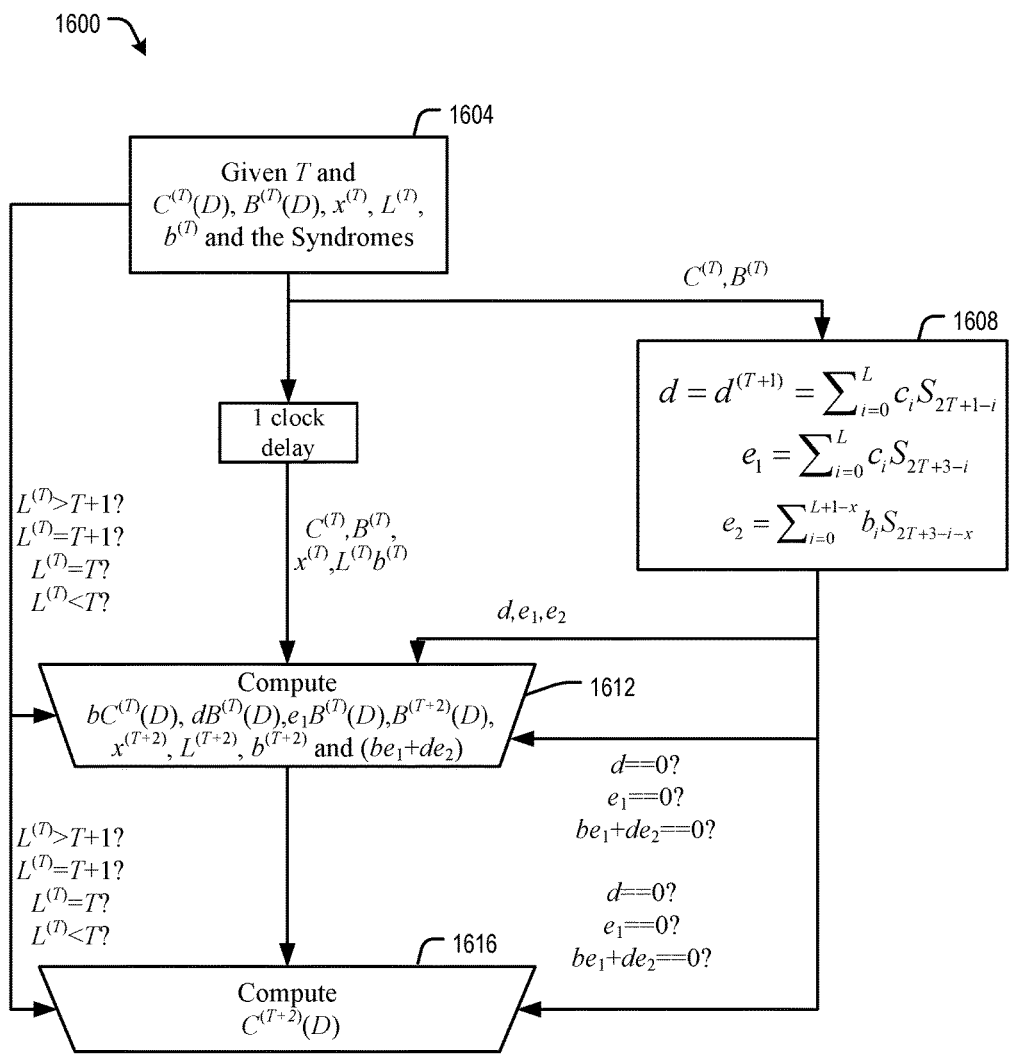
FIG. 16 is a flow chart illustrating operations that may be performed in accordance with a second example of the data storage device of FIG. 14.

FIG. 16 is a flow chart illustrating aspects of operations 1600 that may be performed in accordance with the second example of the data storage device 102 described with reference to FIG. 14. The operations 1600 may be performed by the error locator polynomial generator circuit 1410 of FIG. 14.

The operations 1600 include receiving a set of parameters associated with the representation 1476, at 1604. The set of parameters may include $C^{(T)}(D)$, $B^{(T)}(D)$, $x^{(T)}$, $L^{(T)}$, $b^{(T)}$ and syndromes (e.g., the syndrome polynomial 1454). The set of parameters may be received at the error locator polynomial generator circuit 1410.

The operations 1600 further include determining $d^{(T+1)}$ (e.g., the first value 1420 of the parameter 1418), $e_1$ (e.g., the first auxiliary parameter 1434), and $e_2$ (e.g., the second auxiliary parameter 1436), at 1608. The values of $d^{(T+1)}$, $e_1$, and $e_2$ may be determined during the first cycle 1404 of the clock signal 1402, and $C^{(T)}(D)$, $B^{(T)}(D)$, $x^{(T)}$, $L^{(T)}$, $b^{(T)}$ and the syndromes may be determined during a cycle that precedes the first cycle 1404, as an illustrative example.

The operations 1600 further include determining $bC^{(T)}(D)$, $dB^{(T)}(D)$, $e_1B^{(T)}(D)$, $B^{(T+2)}(D)$, $x^{(T+2)}$, $L^{(T+2)}$, $b^{(T+2)}$, and $(be_1+de_2)$, at 1612. For example, $bC^{(T)}(D)$, $dB^{(T)}(D)$, $e_1B^{(T)}(D)$, $B^{(T+2)}(D)$, $x^{(T+2)}$, $L^{(T+2)}$, $b^{(T+2)}$, and $(be_1+de_2)$ may be determined during the second cycle 1406.

The operations 1600 further include determining $C^{(T+2)}(D)$, at 1616. For example, $C^{(T+2)}(D)$ may be determined during the third cycle 1408.

Figure 17:
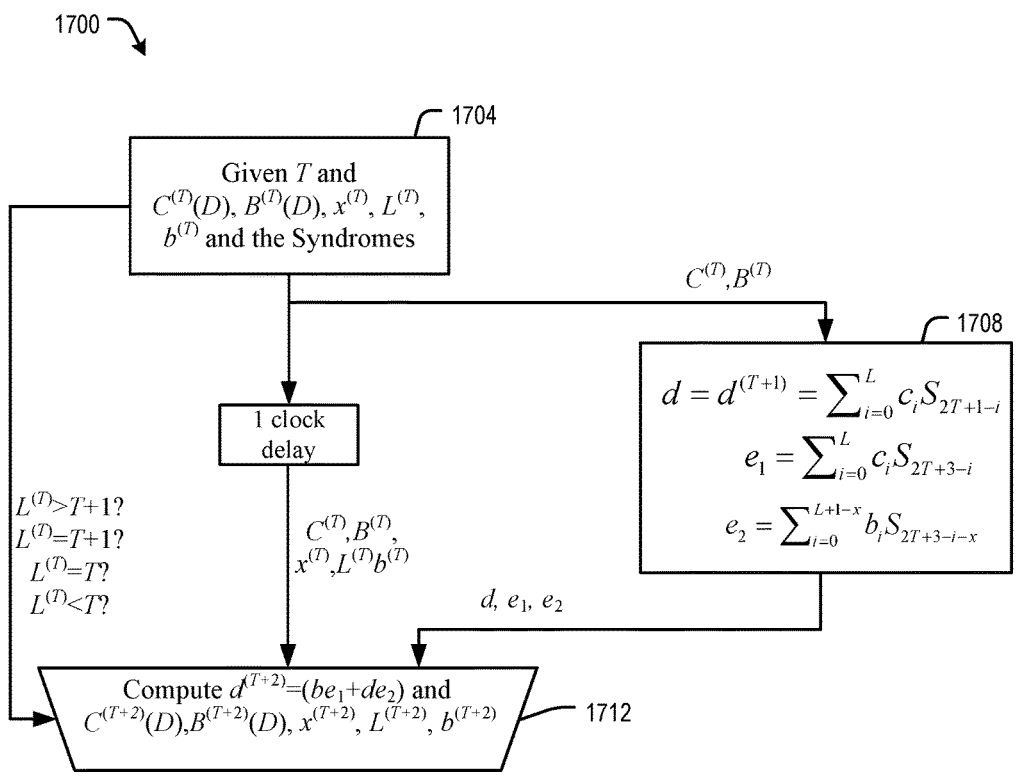
FIG. 17 is a flow chart illustrating operations that may be performed in accordance with a third example of the data storage device of FIG. 14.

FIG. 17 is a flow chart illustrating aspects of operations 1700 that may be performed in accordance with the third example of the data storage device 102 described with reference to FIG. 14. The operations 1700 may be performed by the error locator polynomial generator circuit 1410 of FIG. 14.

The operations 1700 include receiving a set of parameters associated with the representation 1476, at 1704. The set of parameters may include $C^{(T)}(D)$, $B^{(T)}(D)$, $x^{(T)}$, $L^{(T)}$, $b^{(T)}$ and syndromes (e.g., the syndrome polynomial 1454). The set of parameters may be received at the error locator polynomial generator circuit 1410.

The operations 1700 further include determining $d^{(T+1)}$ (e.g., the first value 1420 of the parameter 1418), $e_1$ (e.g., the first auxiliary parameter 1434), and $e_2$ (e.g., the second auxiliary parameter 1436), at 1708. The values of $d^{(T+1)}$, $e_1$, and $e_2$ may be determined during the first cycle 1404 of the clock signal 1402, and $C^{(T)}(D)$, $B^{(T)}(D)$, $x^{(T)}$, $L^{(T)}$, $b^{(T)}$ and the syndromes may be determined during a cycle that precedes the first cycle 1404, as an illustrative example.

The operations further include determining $d^{(T+2)}=(be_1+de_2)$, $C^{(T+2)}(D)$, $B^{(T+2)}(D)$, $x^{(T+2)}$, $L^{(T+2)}$, and $b^{(T+2)}$, at 1712. For example, $d^{(T+2)}=(be_1+de_2)$, $C^{(T+2)}(D)$, $B^{(T+2)}(D)$, $x^{(T+2)}$, $L^{(T+2)}$, and $b^{(T+2)}$ may be determined during the second cycle 1406.

Figure 18:
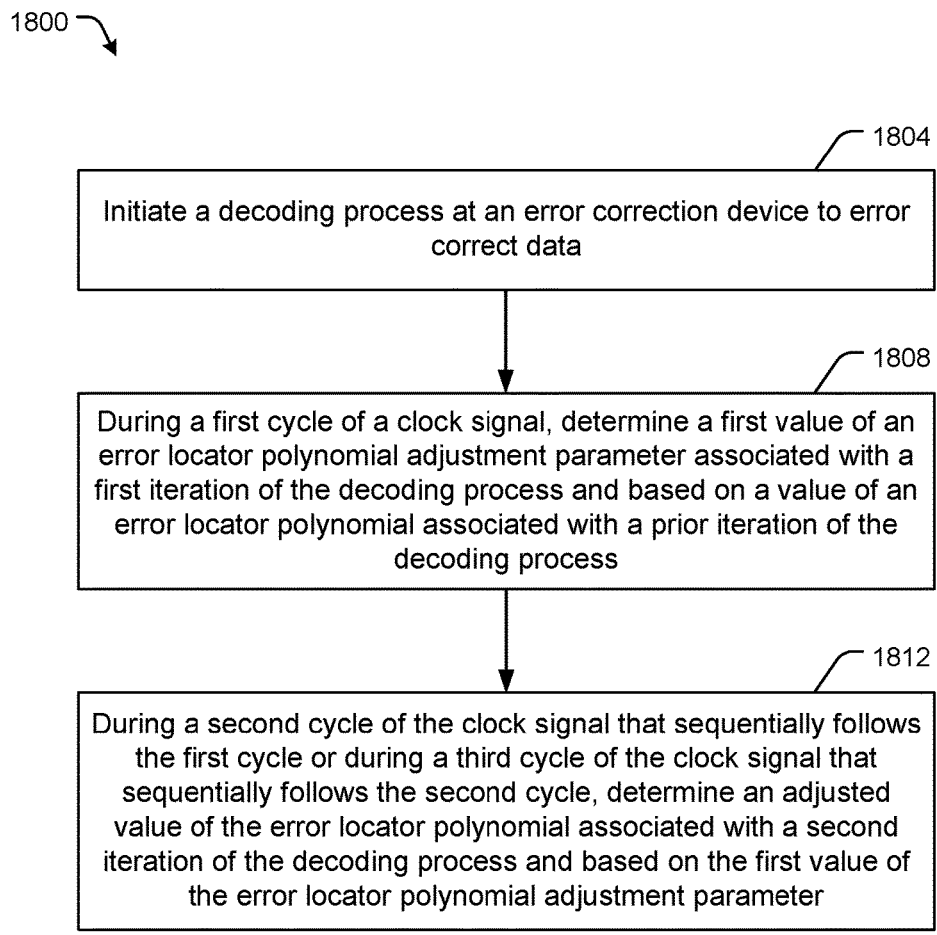
FIG. 18 is a flow chart of a particular example of a method of determining an error locator polynomial that may be performed by the data storage device of FIG. 14.

Referring to FIG. 18, an illustrative example of a method is depicted and generally designated 1800. In an illustrative example, the method 1800 is performed by a data storage device, such as by error locator polynomial generator circuit 1410 of the data storage device 102 of FIG. 14.

The method 1800 includes initiating a decoding process at an error correction device to error correct data, at 1804. For example, the decoder 1450 may receive the representation 1476 (e.g., from the memory device 103 via the memory interface 132) and may initiate the decoding process to correct one or more errors that may be present in the representation 1476.

The method 1800 further includes determining, during a first cycle of a clock signal, a first value of an error locator polynomial adjustment parameter associated with a first iteration of the decoding process, at 1808. The first value of the error locator polynomial adjustment parameter is based on a value of an error locator polynomial associated with a prior iteration of the decoding process. To illustrate, the error locator polynomial adjustment parameter may correspond to the parameter 1418, and the first value 1420 of the parameter 1418 may be associated with the first iteration 1416 (e.g., iteration T). The error locator polynomial generator circuit 1410 may be configured to determine the first value 1420 of the parameter 1418 during the first cycle 1404 of the clock signal 1402 based on a value of the error locator polynomial 1412 (e.g., based on $C^T$) that is associated with a prior iteration of the decoding process (e.g., iteration T=0).

The method 1800 further includes determining, during a second cycle of the clock signal that sequentially follows the first cycle or during a third cycle of the clock signal that sequentially follows the second cycle, an adjusted value of the error locator polynomial, at 1812. The adjusted value of the error locator polynomial is associated with a second iteration of the decoding process and is based on the first value of the error locator polynomial adjustment parameter. To illustrate, the error locator polynomial generator circuit 1410 may be configured to determine the adjusted value 1424 of the error locator polynomial 1412 during the second cycle 1406 based on the first value 1420 of the parameter 1418. The adjusted value 1424 of the error locator polynomial 1412 is associated with the second iteration 1422 (e.g., iteration T+1).

In some implementations, the error locator polynomial generator circuit 1410 is configured to determine the second value 1422 of the parameter 1418 during the second cycle 1406 and to determine the adjusted value 1422 of the error locator polynomial 1412 based on the second value 1422 of the parameter 1418 during the third cycle 1408. To illustrate, the error locator polynomial generator circuit 1410 may be configured to operate in accordance with one or more aspects of the first example described with reference to FIG. 14, with one or more aspects described with reference to the operations 1500 of FIG. 15, or a combination thereof.

In another implementation, the error locator polynomial generator circuit 1410 is configured to determine the adjusted value 1422 of the error locator polynomial 1412 during the second cycle 1406. To illustrate, the error locator polynomial generator circuit 1410 may be configured to operate in accordance with one or more aspects of the second example described with reference to FIG. 14, with one or more aspects described with reference to the operations 1600 of FIG. 16, or a combination thereof.

In another implementation, the error locator polynomial generator circuit 1410 is configured to determine the adjusted value 1422 of the error locator polynomial 1412 using a three-input multiplier such as the three-input multiplier circuit 1432. The three-input multiplier circuit 1432 may be configured to determine the adjusted value 1422 of the error locator polynomial 1412 during the second cycle 1406. In this example, the error locator polynomial generator circuit 1410 may be configured to operate in accordance with one or more aspects of the third example described with reference to FIG. 14, with one or more aspects described with reference to the operations 1700 of FIG. 17, or a combination thereof.

Figure 19:
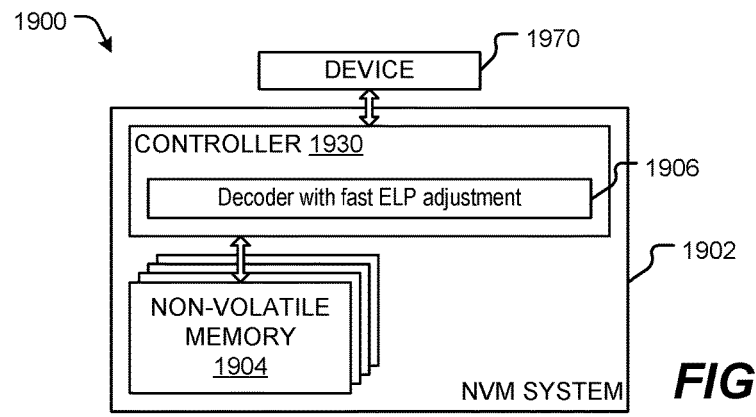
FIG. 19 is a block diagram of a particular illustrative embodiment of a non-volatile memory system that includes a data storage device, such as the data storage device of FIG. 1, the data storage device of FIG. 3, the data storage device of FIG. 8, or the data storage device or FIG. 14.

Referring to FIG. 19, a system 1900 includes a non-volatile memory system 1902 (e.g., the data storage device 102 of FIG. 1 or FIG. 8, the data storage device 302 of FIG. 3, or the data storage device 1402 of FIG. 14) that may be coupled to a device 1970 (e.g., the device 170). The non-volatile memory system 1902 includes a controller 1930 (e.g., the controller 130 or the controller 330) and non-volatile memory that may be made up of one or more non-volatile memory dies 1904 (e.g., one or more memory dies included in the memory device 103). As used herein, the term "memory die" refers to the collection of non-volatile memory cells, and associated circuitry for managing the physical operation of those non-volatile memory cells, that are formed on a single semiconductor substrate. The controller 1930 interfaces with the device 1970 and transmits command sequences for read, program, and erase operations to the one or more non-volatile memory dies 1904.

The controller 1930 includes a decoder 1906 configured to perform fast error locator polynomial adjustment. The decoder 1906 may correspond to the decoder 1450 of FIG. 14, as an illustrative example.

The controller 1930 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 1930 may be configured with hardware and/or firmware to perform the various functions described below and shown in the flow diagrams. Also, some of the components shown as being internal to the controller 1930 can be stored external to the controller 1930, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 1904 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 1930 and the one or more non-volatile memory dies 1904 may be any suitable flash interface, such as Toggle Mode 200, 400, or 800. In one embodiment, the non-volatile memory system 1902 may be a card based system, such as a secure digital (SD) or a micro secure digital (micro-SD) card. In an alternate embodiment, the non-volatile memory system 1902 may be part of an embedded memory system.

Although, in the example illustrated in FIG. 19, the non-volatile memory system 1902 (sometimes referred to herein as a storage module) includes a single channel between the controller 1930 and the one or more non-volatile memory dies 1904, the subject matter described herein is not limited to having a single memory channel. For example, in some NAND memory system architectures (such as the ones shown in FIGS. 20 and 21), 2, 4, 8 or more NAND channels may exist between the controller 1930 and the NAND memory device, depending on controller capabilities. In any of the embodiments described herein, more than a single channel may exist between the controller 1930 and the one or more non-volatile memory dies 1904, even if a single channel is shown in the drawings.

Figure 20:
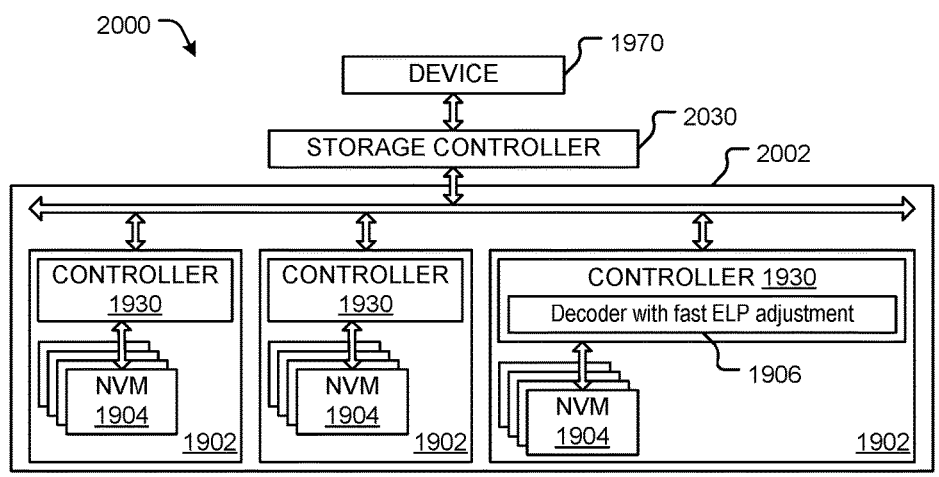
FIG. 20 is a block diagram of a particular illustrative embodiment of a storage system including a plurality of the non-volatile memory systems of FIG. 19.

FIG. 20 illustrates a storage system 2000 that includes multiple non-volatile memory systems 1902. As such, storage system 2000 may include a storage controller 2030 that interfaces with the device 1970 (e.g., a host device) and with a storage system 2002, which includes a plurality of non-volatile memory systems 1902. The interface between the storage controller 2030 and the non-volatile memory systems 1902 may be a bus interface, such as a serial advanced technology attachment (SATA) or peripheral component interface express (PCIe) interface. The storage system 2000 may correspond to a solid state drive (SSD), such as found in portable computing devices, such as laptop computers, and tablet computers. One or more of the controllers 1930 of FIG. 19 may include the decoder 1906. Alternatively or in addition, storage controller 2030 may include the decoder 1906.

Figure 21:
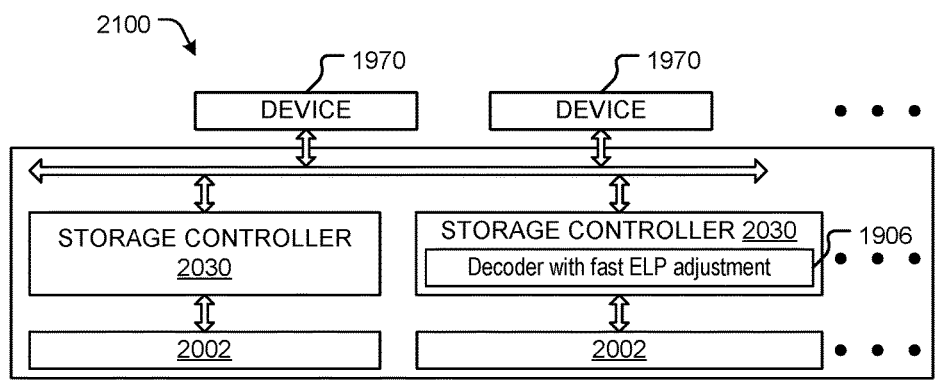
FIG. 21 is a block diagram of a particular illustrative embodiment of a hierarchical storage system that includes a plurality of the storage systems of FIG. 19.

FIG. 21 is a block diagram illustrating a hierarchical storage system 2100. The hierarchical storage system 2100 includes a plurality of storage controllers 2030, each of which controls a respective storage system 2002. Devices 1970 (e.g., one or more host devices or accessing devices) may access memories within the hierarchical storage system 2100 via a bus interface. In one embodiment, the bus interface may be an NVMe or fiber channel over Ethernet (FCoE) interface. In one embodiment, the hierarchical storage system 2100 illustrated in FIG. 21 may be a rack mountable mass storage system that is accessible by multiple host computers, such as would be found in a data center or other location where mass storage is needed. One or more storage controllers 2030 of FIG. 21 may include the decoder 1906.

Figure 22:
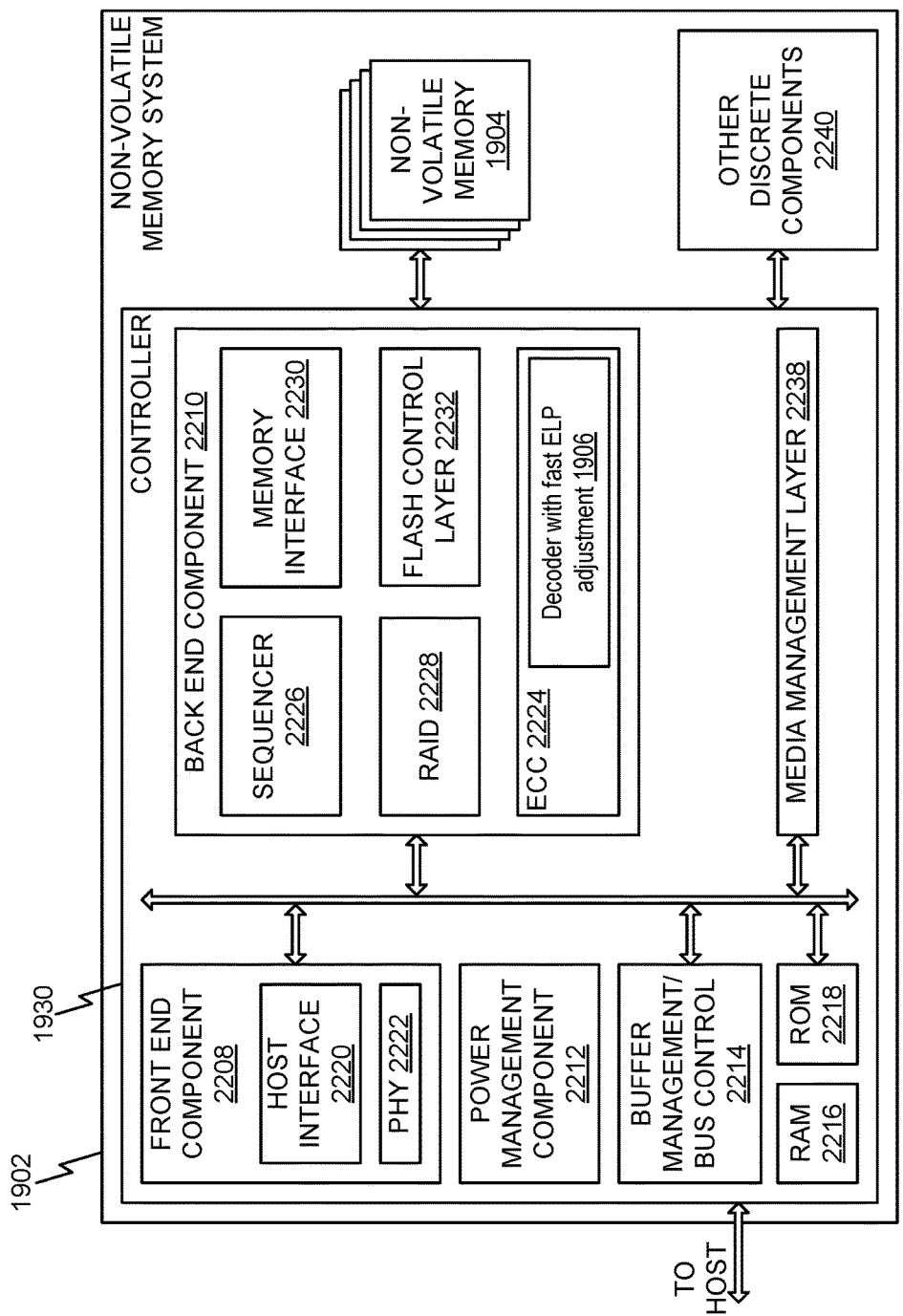
FIG. 22 is a block diagram of a memory system and depicts components of a particular illustrative embodiment of a controller of the non-volatile memory system of FIG. 19.

FIG. 22 is a block diagram illustrating exemplary components of the controller 1930 of the non-volatile memory system 1902 in more detail. The controller 1930 may include the decoder 1906. The controller 1930 also includes a front end component 2208 that interfaces with a host device, a back end component 2210 that interfaces with the one or more non-volatile memory dies 1904, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 1930, a buffer manager/bus controller 2214 manages buffers in random access memory (RAM) 2216 and controls the internal bus arbitration of the controller 1930. A read only memory (ROM) 2218 stores system boot code. Although illustrated in FIG. 22 as located within the controller 1930, in other embodiments one or both of the RAM 2216 and the ROM 2218 may be located externally to the controller 1930. In yet other embodiments, portions of RAM and ROM may be located both within the controller 1930 and outside the controller 1930.

Front end component 2208 includes a host interface 2220 and a physical layer interface (PHY) 2222 that provide the electrical interface with the host device or next level storage controller. The choice of the type of host interface 2220 can depend on the type of memory being used. Examples of host interfaces 2220 include, but are not limited to, SATA, SATA Express, SAS, Fibre Channel, USB, PCIe, and NVMe. The host interface 2220 typically facilitates transfer for data, control signals, and timing signals.

Back end component 2210 includes an error correcting code (ECC) engine 2224 that encodes the data received from the host device, and decodes and error corrects the data read from the non-volatile memory. A command sequencer 2226 generates command sequences, such as program and erase command sequences, to be transmitted to the one or more non-volatile memory dies 1904. A RAID (Redundant Array of Independent Drives) component 2228 manages generation of RAID parity and recovery of failed data. The RAID parity may be used as an additional level of integrity protection for the data being written into the one or more non-volatile memory dies 1904. In some cases, the RAID component 2228 may be a part of the ECC engine 2224. A memory interface 2230 provides the command sequences to non-volatile memory die 1904 and receives status information from the one or more non-volatile memory dies 1904. For example, the memory interface 2230 may be a double data rate (DDR) interface, such as a Toggle Mode 200, 400, or 800 interface. A flash control layer 2232 controls the overall operation of back end component 2210.

Additional components of the non-volatile memory system 1902 illustrated in FIG. 22 include a power management component 2212 and a media management layer 2238, which performs wear leveling of memory cells of the one or more non-volatile memory dies 1904. Non-volatile memory system 1902 also includes other discrete components 2240, such as external electrical interfaces, external RAM, resistors, capacitors, or other components that may interface with the controller 1930. In alternative embodiments, one or more of the physical layer interface 2222, RAID component 2228, media management layer 2238 and buffer management/bus controller 2214 are optional components that are omitted from the controller 1930.

Figure 23:
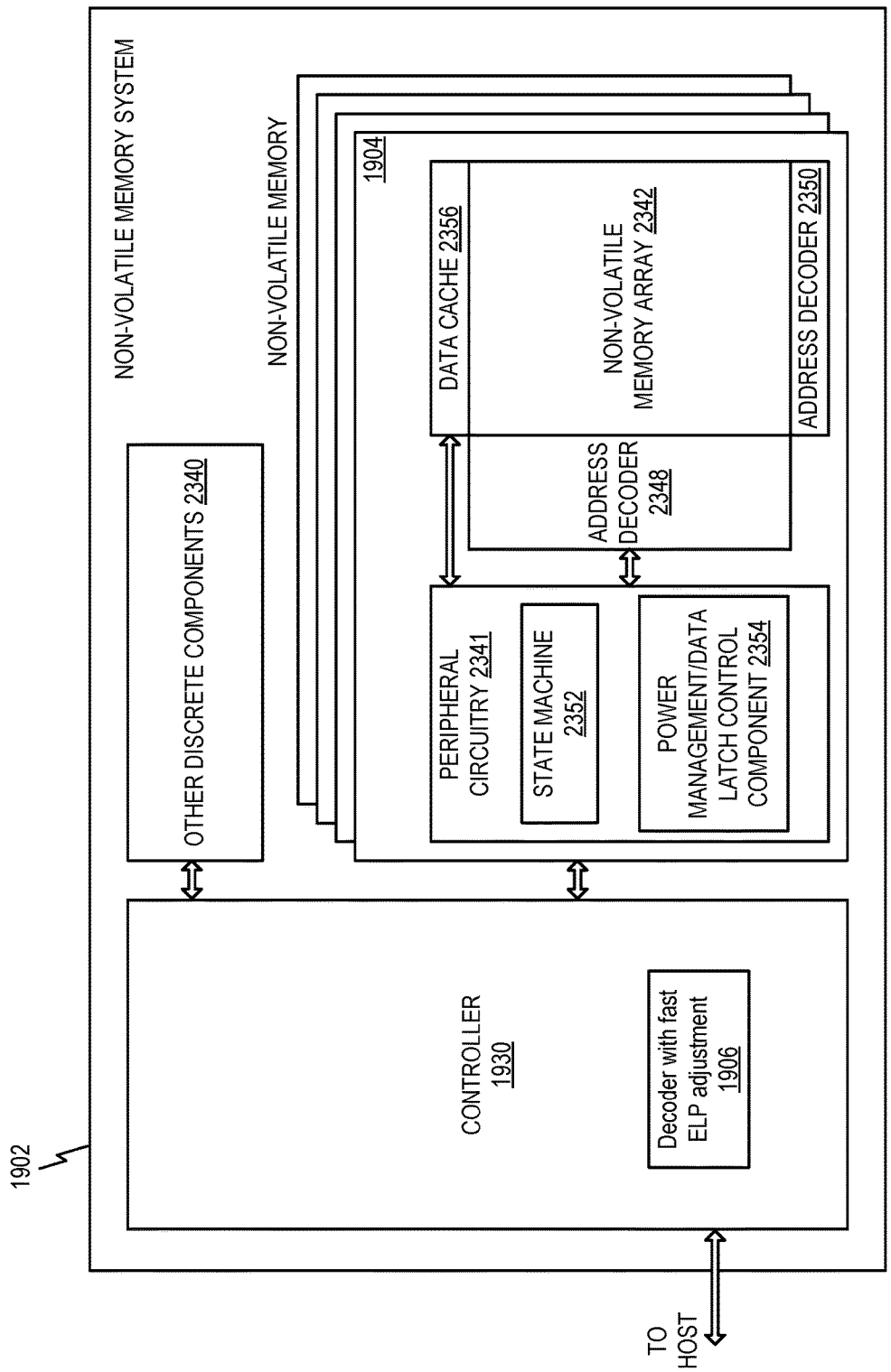
FIG. 23 is a block diagram of a memory system and depicts components of a particular illustrative embodiment of a non-volatile memory die of the non-volatile memory system of FIG. 19.

FIG. 23 is a block diagram illustrating exemplary components of the one or more non-volatile memory dies 1904 of the non-volatile memory system 1902 in more detail. The one or more non-volatile memory dies 1904 include peripheral circuitry 2341 and a non-volatile memory array 2342. The non-volatile memory array 2342 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 2341 includes a state machine 2352 that provides status information to the controller 1930. The peripheral circuitry 2341 may also include a power management or data latch control component 2354. The one or more non-volatile memory dies 1904 further include discrete components 2340, an address decoder 2348, an address decoder 2350, and a data cache 2356 that caches data. FIG. 23 also illustrates that the controller 1930 may include the decoder 1906.

In conjunction with the described embodiments, an apparatus includes means (e.g., the memory interface 132) for receiving a representation of a codeword, such as the representation 1476. The apparatus further includes means (e.g., the error locator polynomial generator circuit 1410) for determining, during a first cycle of a clock signal (e.g., during the first cycle 1404 of the clock signal 1402), a first value of a parameter (e.g., the first value 1420 of the parameter 1418) and for determining, during a second cycle of the clock signal that sequentially follows the first cycle or during a third cycle of the clock signal that sequentially follows the second cycle (e.g., during the second cycle 1406 or during the third cycle 1408), an adjusted value of an error locator polynomial (e.g., the adjusted value 1424 of the error locator polynomial 1412). The first value of the parameter is associated with a first iteration (e.g., the first iteration 1416, which may correspond to iteration T) of a decode operation to decode the representation of the codeword. The first value of the parameter is based on a value of the error locator polynomial (e.g., the value 1414 of the error locator polynomial 1412, which may correspond to $C^T$) associated with a prior iteration of the decode operation (e.g., based on iteration T). The adjusted value of the error locator polynomial is associated with a second iteration (e.g., the second iteration 1422, which may correspond to iteration T+1) of the decode operation and is based on the first value of the parameter.

The apparatus may further include means (e.g., the syndrome generator circuit 1452) for determining a syndrome polynomial (e.g., the syndrome polynomial 1454) associated with the representation of the codeword. The means for determining the first value may be configured to determine the adjusted value of the error locator polynomial further based on the syndrome polynomial. The apparatus may also include means (e.g., the error corrector circuit 1456) for identifying one or more error locations (e.g., the one or more error locations 1458) of the representation of the codeword based on the adjusted value of the error locator polynomial.

Although various components depicted herein are illustrated as block components and described in general terms, such components may include one or more microprocessors, state machines, or other circuits configured to enable such components to perform one or more operations described herein. For example, one or more of the error locator polynomial generator circuit 1410, the syndrome generator circuit 1452, or the error corrector circuit 1456 may represent physical components, such as hardware controllers, state machines, logic circuits, or other structures, to enable the decoder 1450 to perform one or more operations described herein.

Alternatively or in addition, one or more of the error locator polynomial generator circuit 1410, the syndrome generator circuit 1452, or the error corrector circuit 1456 may be implemented using a microprocessor or microcontroller programmed to perform decoding operations. In a particular embodiment, one or more of the error locator polynomial generator circuit 1410, the syndrome generator circuit 1452, or the error corrector circuit 1456 include a processor executing instructions (e.g., firmware) that are stored at the memory 104. Alternatively, or in addition, executable instructions that are executed by the processor may be stored at a separate memory location that is not part of the memory 104, such as at a read-only memory (ROM).

It should be appreciated that one or more operations described herein as being performed by the controller 130 and the controller 330 may be performed at the memory device 103. As an illustrative example, one or more decoding operations described with reference to the decoder 802 may be performed at the memory device 103.

The data storage devices 102, 302 may be coupled to, attached to, or embedded within one or more accessing devices, such as within a housing of the device 170. For example, the data storage devices 102, 302 may be embedded within the device 170 in accordance with a Joint Electron Devices Engineering Council (JEDEC) Solid State Technology Association Universal Flash Storage (UFS) configuration. To further illustrate, the data storage devices 102, 302 may be integrated within an electronic device (e.g., the device 170), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage devices 102, 302 may be implemented in a portable device configured to be selectively coupled to one or more external devices, such as a host device. For example, the data storage devices 102, 302 may be removable from the device 170 (i.e., "removably" coupled to the device 170). As an example, the data storage devices 102, 302 may be removably coupled to the device 170 in accordance with a removable universal serial bus (USB) configuration.

The device 170 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 170 may communicate via a controller, which may enable the device 170 to communicate with the data storage devices 102, 302. The device 170 may operate in compliance with a JEDEC Solid State Technology Association industry specification, such as an embedded MultiMedia Card (eMMC) specification or a Universal Flash Storage (UFS) Host Controller Interface specification. The device 170 may operate in compliance with one or more other specifications, such as a Secure Digital (SD) Host Controller specification as an illustrative example. Alternatively, the device 170 may communicate with the data storage devices 102, 302 in accordance with another communication protocol. In some implementations, the data storage devices 102, 302 may be integrated within a network-accessible data storage system, such as an enterprise data system, an NAS system, or a cloud data storage system, as illustrative examples.

In some implementations, one or both of the data storage devices 102, 302 may include a solid state drive (SSD). One or both of the data storage devices 102, 302 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, one or both of the data storage devices 102, 302 may be coupled to the device 170 via a network. For example, the network may include a data center storage system network, an enterprise storage system network, a storage area network, a cloud storage network, a local area network (LAN), a wide area network (WAN), the Internet, and/or another network.

To further illustrate, one or both of the data storage devices 102, 302 may be configured to be coupled to the device 170 as embedded memory, such as in connection with an embedded MultiMedia Card (eMMC®) (trademark of JEDEC Solid State Technology Association, Arlington, Va.) configuration, as an illustrative example. One or both of the data storage devices 102, 302 may correspond to an eMMC device. As another example, one or both of the data storage devices 102, 302 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). One or both of the data storage devices 102, 302 may operate in compliance with a JEDEC industry specification. For example, the data storage devices 102, 302 may operate in compliance with a JEDEC eMMC specification, a JEDEC Universal Flash Storage (UFS) specification, one or more other specifications, or a combination thereof.

The memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level.

Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
   an interface configured to receive a representation of a codeword; and
   a decoder coupled to the interface and configured to perform a decode operation to decode the representation of the codeword, the decoder comprising:
   an error locator polynomial generator circuit configured to determine, during a first cycle of a clock signal, a first value of a parameter associated with a first iteration of the decode operation and based on a value of an error locator polynomial associated with a prior iteration of the decode operation,
   wherein the error locator polynomial generator circuit is further configured to determine, during a second cycle of the clock signal that sequentially follows the first cycle or during a third cycle of the clock signal that sequentially follows the second cycle, an adjusted value of the error locator polynomial associated with a second iteration of the decode operation and based on the first value of the parameter.

2. The apparatus of claim 1, wherein the error locator polynomial generator circuit is further configured to determine a second value of the parameter during the second cycle and to determine the adjusted value of the error locator polynomial based on the second value of the parameter and during the third cycle.

3. The apparatus of claim 1, wherein the error locator polynomial generator circuit is further configured to determine the adjusted value of the error locator polynomial during the second cycle.

4. The apparatus of claim 3, further comprising a three-input multiplier of the error locator polynomial generator circuit, the three-input multiplier configured to determine the adjusted value of the error locator polynomial during the second cycle.

5. The apparatus of claim 1, wherein the error locator polynomial generator circuit is further configured to determine the adjusted value of the error locator polynomial in accordance with a Berlekamp-Massey (BM) technique using the first iteration and the second iteration.

6. The apparatus of claim 1, further comprising a syndrome generator circuit of the decoder, the syndrome generator circuit coupled to an input of the error locator polynomial generator circuit and configured to determine a syndrome polynomial based on the representation of the codeword.

7. The apparatus of claim 6, wherein the error locator polynomial generator circuit is further configured to determine, during the first cycle and based on the syndrome polynomial, a first auxiliary parameter and a second auxiliary parameter.

8. The apparatus of claim 7, wherein the error locator polynomial generator circuit is further configured to determine the adjusted value of the error locator polynomial based on the first auxiliary parameter and the second auxiliary parameter.

9. The apparatus of claim 1, further comprising an error corrector circuit of the decoder, the error corrector circuit coupled to an output of the error locator polynomial generator circuit and configured to identify one or more error locations of the representation of the codeword based on the adjusted value of the error locator polynomial.

10. The apparatus of claim 1, further comprising:
a controller that includes the interface and the decoder; and
a non-volatile memory coupled to the controller.

11. A method comprising:
initiating a decoding process at an error correction device to error correct data;
during a first cycle of a clock signal, determining a first value of an error locator polynomial adjustment parameter associated with a first iteration of the decoding process and based on a value of an error locator polynomial associated with a prior iteration of the decoding process; and
during a second cycle of the clock signal that sequentially follows the first cycle or during a third cycle of the clock signal that sequentially follows the second cycle, determining an adjusted value of the error locator polynomial associated with a second iteration of the decoding process and based on the first value of the error locator polynomial adjustment parameter.

12. The method of claim 11, further comprising determining a syndrome polynomial.

13. The method of claim 12, further comprising determining, during the first cycle and based on the syndrome polynomial, a first auxiliary parameter and a second auxiliary parameter.

14. The method of claim 13, wherein the adjusted value of the error locator polynomial is determined further based on the first auxiliary parameter and the second auxiliary parameter.

15. The method of claim 11, further comprising identifying one or more error locations of the data based on the adjusted value of the error locator polynomial.

16. The method of claim 15, wherein the one or more error locations are identified using a Chien search technique.

17. The method of claim 11, wherein the parameter corresponds to a particular value of an error locator polynomial adjustment parameter, and further comprising, during a particular iteration of the decoding process preceding the first iteration, determining the parameter based on the first value of the error locator polynomial.

18. An apparatus comprising:
means for receiving a representation of a codeword; and
means for determining, during a first cycle of a clock signal, a first value of a parameter associated with a first iteration of a decode operation to decode the representation of the codeword and based on a value of an error locator polynomial associated with a prior iteration of the decode operation and for determining, during a second cycle of the clock signal that sequentially follows the first cycle or during a third cycle of the clock signal that sequentially follows the second cycle, an adjusted value of the error locator polynomial associated with a second iteration of the decode operation and based on the first value of the parameter.

19. The apparatus of claim 18, further comprising means for determining a syndrome polynomial associated with the representation of the codeword, wherein the means for determining the first value is configured to determine the adjusted value of the error locator polynomial further based on the syndrome polynomial.

20. The apparatus of claim 18, further comprising means for identifying one or more error locations of the representation of the codeword based on the adjusted value of the error locator polynomial.

* * * * *